US011139007B2

(12) United States Patent
Sato et al.

(10) Patent No.: US 11,139,007 B2
(45) Date of Patent: Oct. 5, 2021

(54) SEMICONDUCTOR STORAGE DEVICE AND MEMORY SYSTEM

(71) Applicant: KIOXIA CORPORATION, Tokyo (JP)

(72) Inventors: Junichi Sato, Yokohama Kanagawa (JP); Akio Sugahara, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/152,359

(22) Filed: Jan. 19, 2021

(65) Prior Publication Data

US 2021/0142833 A1 May 13, 2021

Related U.S. Application Data

(60) Continuation of application No. 16/986,172, filed on Aug. 5, 2020, now Pat. No. 10,910,023, which is a (Continued)

(30) Foreign Application Priority Data

May 22, 2018 (JP) .............................. JP2018-097573

(51) Int. Cl.
*G11C 5/06* (2006.01)
*G11C 7/10* (2006.01)
*G11C 7/06* (2006.01)
*G11C 16/08* (2006.01)
*G11C 16/24* (2006.01)
(Continued)

(52) U.S. Cl.
CPC ............... *G11C 7/106* (2013.01); *G11C 7/06* (2013.01); *G11C 7/109* (2013.01); *G11C 7/1063* (2013.01); *G11C 7/1087* (2013.01); *G11C 16/08* (2013.01); *G11C 16/24* (2013.01); *G11C 16/26* (2013.01); *G11C 16/32* (2013.01); *G11C 16/34* (2013.01)

(58) Field of Classification Search
CPC ......... G11C 7/106; G11C 7/06; G11C 7/1063; G11C 7/1087; G11C 7/109; G11C 16/08; G11C 16/24; G11C 16/26; G11C 16/32; G11C 16/34
USPC ......................................................... 365/174
See application file for complete search history.

(56) References Cited

U.S. PATENT DOCUMENTS 9,218,242 B2 * 12/2015 Avila .................. G11C 16/3418
9,495,245 B2 * 11/2016 Peddle ................ G06F 12/0246
(Continued)

*Primary Examiner* — Viet Q Nguyen
(74) *Attorney, Agent, or Firm* — Kim & Stewart LLP

(57) ABSTRACT

A semiconductor storage device includes a sense amplifier configured to read and program data in memory cells, a first latch circuit to store read data or program data, a second latch circuit to store the first data transferred from the first latch circuit or the second data before the second data is transferred into the first latch circuit, an input/output circuit to output the first data stored in the second latch circuit and to transfer the second data received thereby to the second latch circuit, and a control circuit. Upon receiving a read command while the control circuit is performing a program operation on program data stored in second latch circuit, the control circuit interrupts the program operation to perform the read operation and resumes the program operation on the program data in response to a resume write command sequence that does not include the program data.

10 Claims, 23 Drawing Sheets

Related U.S. Application Data division of application No. 16/116,818, filed on Aug. 29, 2018, now Pat. No. 10,777,239.

(51) Int. Cl.
*G11C 16/26* (2006.01)
*G11C 16/32* (2006.01)
*G11C 16/34* (2006.01)

(56) References Cited

U.S. PATENT DOCUMENTS

| | | | |
|---|---|---|---|
| 9,558,837 B2 * | 1/2017 | Harada | G11C 16/3459 |
| 9,812,200 B2 | 11/2017 | Intrater et al. | |
| 9,977,752 B2 * | 5/2018 | Takeyama | G11C 7/1084 |
| 10,026,491 B2 * | 7/2018 | Utsunomiya | G11C 11/5628 |
| 10,177,239 B2 * | 1/2019 | Morancho | H01L 29/1075 |
| 10,249,377 B2 * | 4/2019 | Kasai | G11C 11/5628 |
| 10,276,221 B2 | 4/2019 | Sugahara et al. | |
| 10,467,155 B2 | 11/2019 | McVay | |
| 10,504,598 B2 * | 12/2019 | Uehara | G11C 16/0483 |
| 10,636,480 B2 * | 4/2020 | Intrater | G11C 13/0069 |
| 10,777,239 B2 * | 9/2020 | Sato | G11C 16/10 |
| 2013/0016577 A1 | 1/2013 | Nagadomi | |
| 2016/0012891 A1 | 1/2016 | Intrater et al. | |
| 2016/0012902 A1 | 1/2016 | Harada et al. | |
| 2018/0075917 A1 | 3/2018 | Utsunomiya et al. | |
| 2018/0247695 A1 | 8/2018 | Kasai et al. | |
| 2018/0268908 A1 | 9/2018 | Iwasaki et al. | |
| 2019/0088342 A1 | 3/2019 | Shimura et al. | |

\* cited by examiner

SEMICONDUCTOR STORAGE DEVICE AND MEMORY SYSTEM

CROSS-REFERENCE TO RELATED APPLICATION

This application is a continuation of U.S. patent application Ser. No. 16/986,172, filed Aug. 5, 2020, which application is a divisional of U.S. patent application Ser. No. 16/116,818, filed Aug. 29, 2018, now U.S. Pat. No. 10,777,239, issued Sep. 15, 2020, which application is based upon and claims the benefit of priority from Japanese Patent Application No. 2018-097573, filed May 22, 2018, the entire contents of which are incorporated herein by reference.

FIELD

Embodiments described herein relate generally to a semiconductor storage device and a memory system.

BACKGROUND

As one type of semiconductor storage device, a NAND-type flash memory is known. A known NAND-type flash memory includes a plurality of three-dimensionally stacked memory cells.

DETAILED DESCRIPTION

Figure 1:
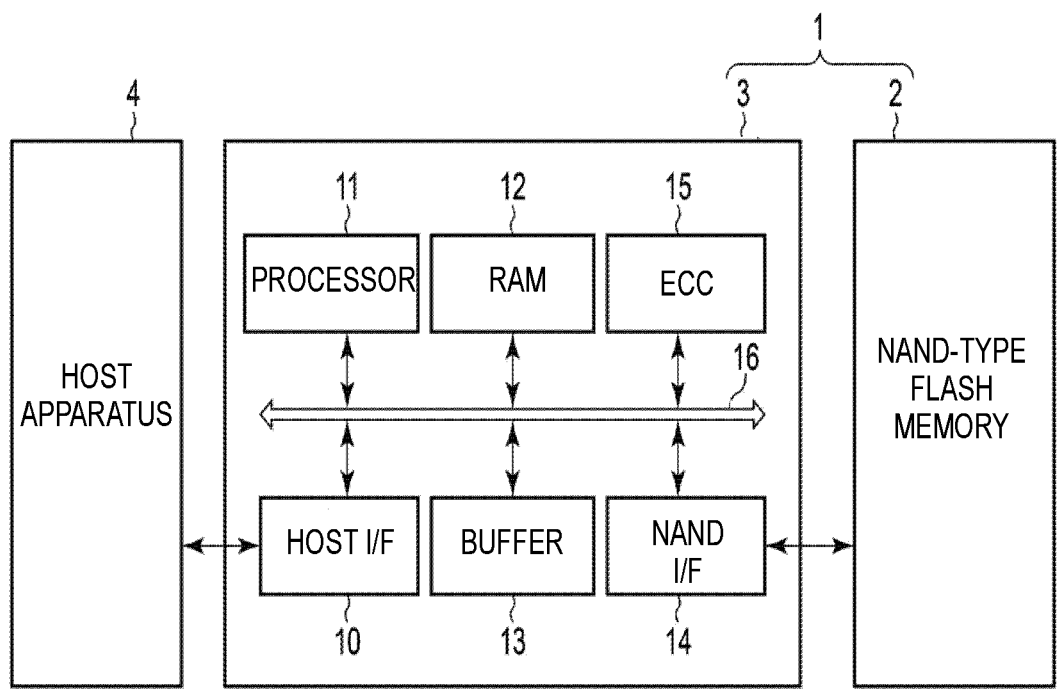
FIG. 1 is a block diagram of a memory system according to a first embodiment.

An embodiment provides a semiconductor storage device and a memory system whose performance is improved in a sequence in which a program operation is suspended and a read operation is performed.

In general, according to one embodiment, a semiconductor storage device includes a plurality of memory cells, a sense amplifier configured to read data from the memory cells and program data in the memory cells, a first latch circuit configured to store first data when the first data is read by the sense amplifier or second data when the second data is transferred into the first latch circuit for programming in the memory cells, a second latch circuit configured to store the first data transferred from the first latch circuit or the second data before the second data is transferred into the first latch circuit for programming, an input/output circuit configured to output the first data stored in the second latch circuit and to transfer the second data received thereby to the second latch circuit, and a control circuit performs a program operation on the memory cells in response to a write command sequence and a read operation on the memory cells in response to a read command sequence. Upon receiving a read command while the control circuit is performing a program operation on program data stored in second latch circuit, the control circuit interrupts the program operation to perform the read operation and resumes the program operation on the program data in response to a resume write command sequence that does not include the program data.

Hereinafter, embodiments will be described with reference to drawings. Several embodiments described below exemplify an apparatus and a method that embody the technical idea of the present disclosure, but the technical idea of the present disclosure is not specified by shapes, structures, arrangements, or the like of constituent parts. Each functional block may be implemented as any one of hardware and software or a combination of both. It is not necessary that respective functional blocks be distinguished as in the following examples. For example, some functions may be executed by functional blocks other than the depicted functional blocks. The depicted functional block may be divided into finer functional sub-blocks. In the following description, elements having the same functions and configurations are denoted by the same reference numerals, and redundant explanations thereof will be made only if necessary.

[1] First Embodiment

[1-1] Configuration of Memory System 1

FIG. 1 is a block diagram of a memory system 1 according to a first embodiment. The memory system 1 includes a NAND-type flash memory (more generally, a semiconductor storage device) 2 and a memory controller 3.

The memory system. 1 may be formed by mounting a plurality of chips, as components of the memory system 1, on a motherboard mounted with a host apparatus, or formed as a system large-scale integrated circuit (LSI) or a system on chip (SoC), which implements the memory system 1 in one module. Examples of the memory system 1 may include a memory card such as a SD™ card, a solid state drive (SSD), an embedded multimedia card (eMMC) and the like.

The NAND-type flash memory 2 includes a plurality of memory cells (also referred to as memory cell transistors), and stores data in a non-volatile manner. A specific configuration of the NAND-type flash memory 2 will be described below.

The memory controller 3, in response to a command from a host apparatus 4, instructs the NAND-type flash memory 2 to perform writing (also referred to as programming), reading, erasing and the like. The memory controller 3 manages a memory space of the NAND-type flash memory 2. The memory controller 3 includes a host interface circuit (host I/F) 10, a processor 11, a random access memory (RAM) 12, a buffer memory 13, a NAND interface circuit (NAND I/F) 14, an error checking and correcting (ECC) circuit 15 and the like. These modules are connected to each other via a bus 16.

The host interface circuit 10 is connected to the host apparatus 4 via a host bus, and performs an interface processing with respect to the host apparatus 4. The host interface circuit 10 performs transmission and reception of commands, addresses, and data to/from the host apparatus 4.

The processor 11 includes, for example, a central processing unit (CPU). The processor 11 controls an overall operation of the memory controller 3. For example, when receiving a write command from the host apparatus 4, the processor 11, in response to the write command, issues a write command based on a NAND interface, to the NAND-type flash memory 2. This also applied to the case of reading and erasing. The processor 11 executes various processings for managing the NAND-type flash memory 2, such as wear leveling.

The RAM 12 is used as a work area of the processor 11, and stores firmware loaded from the NAND-type flash memory 2, various tables created by the processor 11 and the like. The RAM 12 includes a DRAM and/or a SRAM. The buffer memory 13 temporarily stores data transmitted from the host apparatus 4, and temporarily stores data transmitted from the NAND-type flash memory 2. The buffer memory 13 may be contained in the RAM 12.

At the time of a write operation, the ECC circuit 15 generates an error correction code with respect to write data (also referred to as program data), adds the error correction code to the write data, and sends the error correction code-added write data to the NAND interface circuit 14. At the time of a read operation, the ECC circuit 15 performs error detection and/or error correction with respect to read data, using an error correction code in the read data. The ECC circuit 15 may be provided within the NAND interface circuit 14.

The NAND interface circuit 14 is connected to the NAND-type flash memory 2 via a NAND bus, and performs an interface processing with respect to the NAND-type flash memory 2. The NAND interface circuit 14 performs transmission/reception of commands, addresses, and data to/from the NAND-type flash memory 2.

[1-1-1] Configuration of NAND-Type Flash Memory 2

Figure 2:
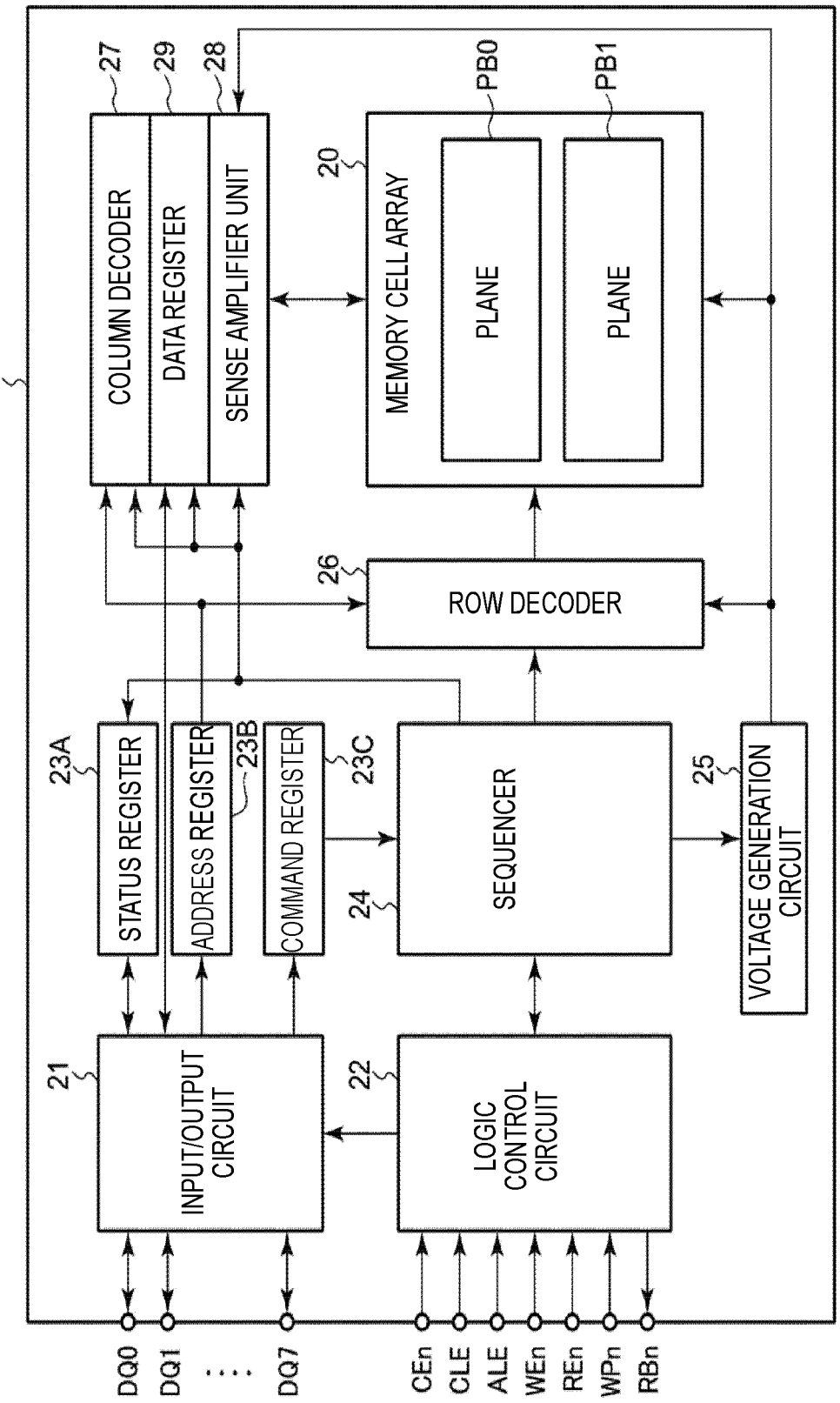
FIG. 2 is a block diagram of a NAND-type flash memory illustrated in FIG. 1.

FIG. 2 is a block diagram of the NAND-type flash memory 2 illustrated in FIG. 1.

The NAND-type flash memory 2 includes a memory cell array 20, an input/output circuit 21, a logic control circuit 22, a register group (including a status register 23A, an address register 23B, and a command register 23C), a sequencer (control circuit) 24, a voltage generation circuit 25, a row decoder 26, a column decoder 27, a sense amplifier unit 28, and a data register (data cache) 29.

The memory cell array 20 includes a plurality of planes PB. In FIG. 2, as an example, two planes PB0 and PB1 are illustrated. Each of the plurality of planes PB includes a plurality of memory cell transistors. In the memory cell array 20, a plurality of bit lines, a plurality of word lines, a source line and the like are arranged in order to apply a voltage to the memory cell transistors. A specific configuration of the plane PB will be described below.

The input/output circuit 21 and the logic control circuit 22 are connected to the memory controller 3 via the NAND bus. The input/output circuit 21 transmits and receives signals DQ (for example, DQ0 to DQ7) to/from the memory controller 3 via the NAND bus.

The logic control circuit 22 receives external control signals (for example, a chip enable signal CEn, a command latch enable signal CLE, an address latch enable signal ALE, a write enable signal WEn, a read enable signal REn, and a write protect signal WPn) from the memory controller 3 via the NAND bus. "n" appended to a signal name indicates active low. The logic control circuit 22 transmits a ready/busy signal RBn to the memory controller 3 via the NAND bus.

The signal Cen enables selection of the NAND-type flash memory 2, and asserted when the corresponding NAND-type flash memory 2 is selected. The signal CLE makes it possible to latch a command transmitted as the signal DQ into a command register. The signal ALE makes it possible to latch an address transmitted as the signal DQ into an address register. The signal WEn enables writing. The signal Ren enables reading. The signal WPn is asserted when writing and erasing are prohibited. The signal RBn indicates whether the NAND-type flash memory 2 is placed in a ready state (a state where accepting a command from the outside is possible) or a busy state (a state where a command from the outside cannot be accepted). The memory controller 3 may know the state of the NAND-type flash memory 2 by receiving the signal RBn from the NAND-type flash memory 2.

The status register 23A temporarily stores data required for operation of the NAND-type flash memory 2. The address register 23B temporarily stores an address. The command register 23C temporarily stores a command. The status register 23A, the address register 23B, and the command register 23C are composed of, for example, SRAMs.

The control circuit 24 receives a command from the command register 23C, and comprehensively controls the NAND-type flash memory 2 according to a sequence based on the command.

The voltage generation circuit 25 receives a power supply voltage from the outside of the NAND-type flash memory 2, and generates a plurality of voltages required for a write operation, a read operation, and an erase operation using the power supply voltage. The voltage generation circuit 25 supplies the generated voltages to the memory cell array 20, the row decoder 26, the sense amplifier unit 28 and the like.

The row decoder 26 receives a row address from the address register 23B, and decodes the row address. The row decoder 26 performs a selecting operation of a word line or the like based on the decoded row address. Then, the row decoder 26 transfers the plurality of voltages required for a write operation, a read operation, and an erase operation, to the memory cell array 20.

The column decoder 27 receives a column address from the address register 23B, and decodes the column address. The column decoder 27 performs a selecting operation of a bit line based on the decoded column address.

The sense amplifier unit 28, at the time of a read operation, detects and amplifies data read from a memory cell transistor to a bit line. The sense amplifier unit 28, at the time of a write operation, transfers write data to the bit line.

The data register 29, at the time of a read operation, temporarily stores data transferred from the sense amplifier unit 28, and transfers the data to the input/output circuit 21. The data register 29, at the time of a write operation, temporarily stores data transferred from the input/output circuit 21, and transfers the data to the sense amplifier unit 28. The data register 29 is composed of an SRAM or the like.

[1-1-2] Configuration of Input/Output Circuit 21

Figure 3:
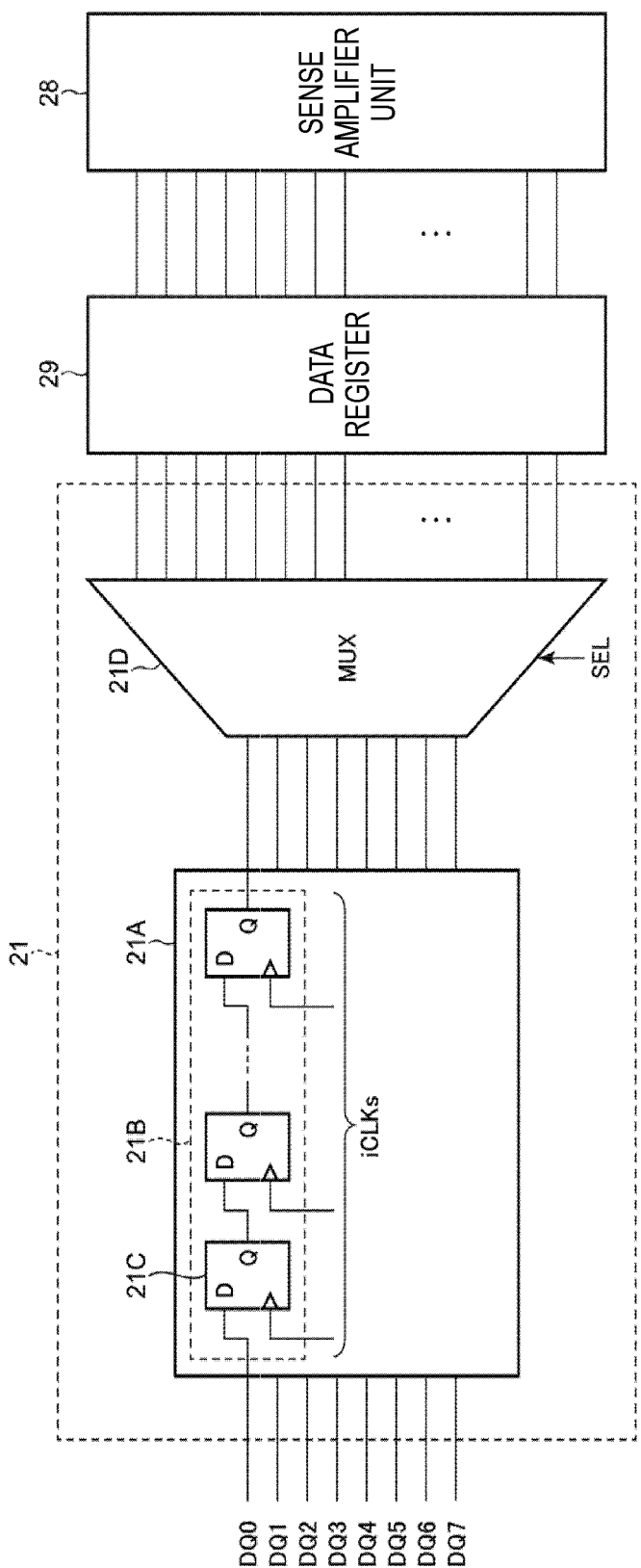
FIG. 3 is a block diagram of an input/output circuit illustrated in FIG. 2.

FIG. 3 is a block diagram of the input/output circuit 21 illustrated in FIG. 2. The input/output circuit 21 includes a shift register unit 21A and a multiplexer 21D.

The shift register unit 21A includes eight shift registers 21B corresponding to signal lines DQ0 to DQ7. FIG. 3 illustrates one shift register 21B connected to the signal line DQ0, as a representative. Although not illustrated, the shift register 21B illustrated in FIG. 3 is also connected to each of the signal lines DQ1 to DQ7.

The shift register 21B includes a plurality of flip-flops 21C connected in series. The number of the flip-flops 21C in the shift register 21B is properly set according to a timing control of a signal DQ, and is, for example, eight in the present embodiment.

An input terminal D of the first stage flip-flop 21C is connected to the signal line DQ0, an output terminal Q thereof is connected to an input terminal D of the following stage flip-flop 21C, and to a clock terminal thereof, an internal clock iCLK is input from the sequencer 24. The flip-flop 21C latches input data at a timing when the internal clock iCLK rises. An output terminal Q of the final stage flip-flop 21C is connected to one among a plurality of input terminals of the multiplexer 21D. The internal clock iCLK input to the plurality of flip-flops 21C includes a plurality of internal clocks iCLK having different cycles.

A plurality of output terminals of the multiplexer 21D are connected to the data register 29 via a plurality of signal lines. In the case of a two-plane configuration, the number of the signal lines connecting the multiplexer 21D to the data register 29 is 16 in total, that is, eight for the plane PB0, and eight for the plane PB1. A control signal SEL is input to a control terminal of the multiplexer 21D from the sequencer 24. The control signal SEL is a signal by which the plane PB is selected. According to the control signal SEL, the multiplexer 21D connects the eight signal lines connected to the shift register unit 21A, to eight out of 16 signal lines connected to the data register 29. The multiplexer 21D transfers data of 8 bits at a time, to the data register 29.

Although not illustrated, the shift register unit 21A includes a shift register for data output. The shift register for data output is connected in parallel with the shift register unit 21A in FIG. 3. The internal clock iCLK is common to a shift register for data input and the shift register for data output.

[1-1-3] Configuration of Plane PB

Figure 4:
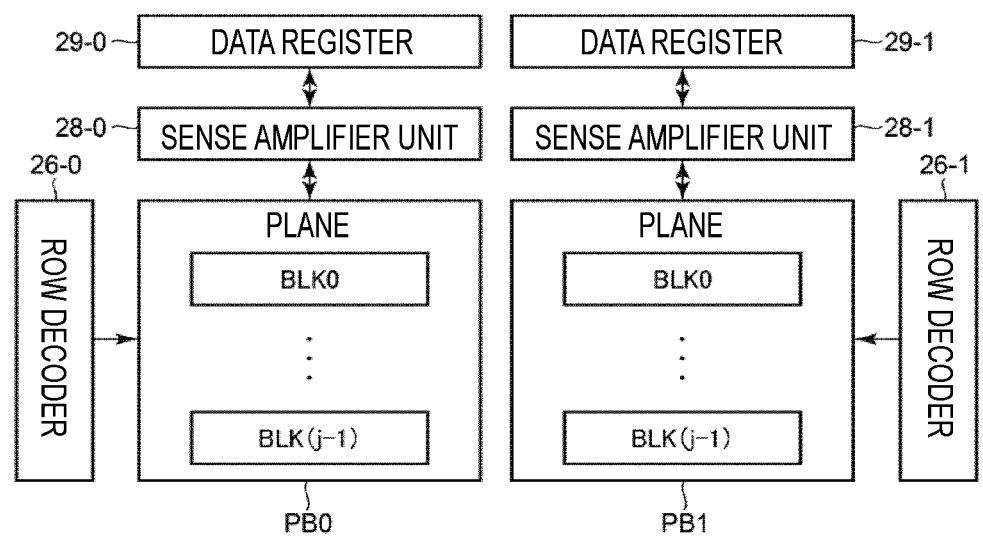
FIG. 4 is a block diagram of planes illustrated in FIG. 2.

FIG. 4 is a block diagram of the planes PB0 and PB1 illustrated in FIG. 2 and peripheral circuits thereof.

Each of the planes PB0 and PB1 includes j blocks BLK0 to BLK(j−1). j represents an integer of 1 or more. The number of blocks BLK in the plane PB0 may be different from that in PB1.

Each of the plurality of blocks BLK includes a plurality of memory cell transistors. The memory cell transistor includes an electrically rewritable memory cell. A specific configuration of the block BLK will be described below.

The row decoder 26, the sense amplifier unit 28, and the data register 29 are provided for each plane PB. That is, a row decoder 26-0 and a sense amplifier unit 28-0 are connected to the plane PB0. A data register 29-0 is connected to the sense amplifier unit 28-0. A row decoder 26-1 and a sense amplifier unit 28-1 are connected to the plane PB1. A data register 29-1 is connected to the sense amplifier unit 28-1.

Although not illustrated, the column decoder 27 is also provided for each plane PB.

[1-1-4] Configuration of Block BLK

Figure 5:
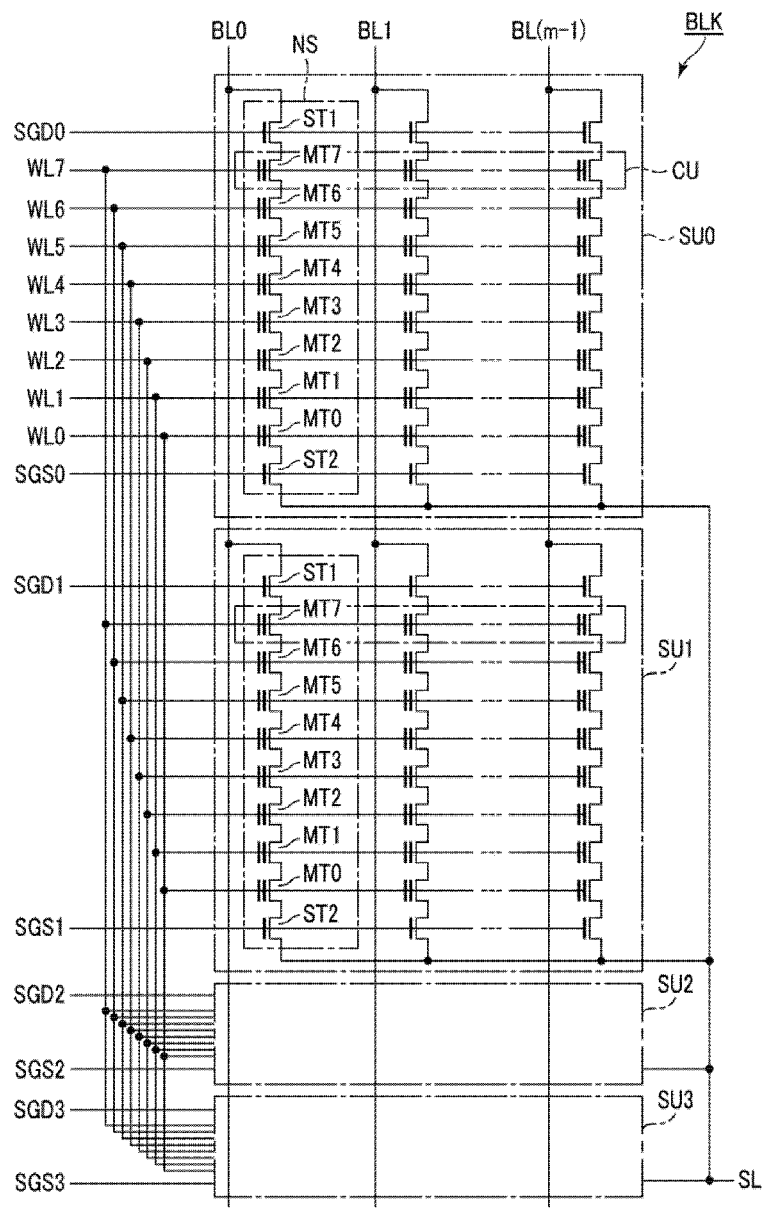
FIG. 5 is a circuit diagram of one block in a plane.

FIG. 5 is a circuit diagram of one block BLK in the plane PB. Each of the plurality of blocks BLK includes a plurality of string units SU. In FIG. 5, four string units SU0 to SU3 are illustrated. The number of the string units SU in one block BLK may be freely set.

Each of the plurality of string units SU includes a plurality of NAND strings (more generally, memory strings) NS. The number of the NAND strings NS in one string unit SU may be freely set.

Each of the plurality of NAND strings NS includes a plurality of memory cell transistors MT, and two select transistors ST1 and ST2. The plurality of memory cell transistors MT are connected in series between a source of the select transistor ST1 and a drain of the select transistor ST2. In this specification, the memory cell transistor may be referred to as a memory cell or a cell. FIG. 5 illustrates, for the sake of simplicity, a configuration example in which the NAND string NS includes eight memory cell transistors MT (MT0 to MT7). However, the number of memory cell transistors MT in the NAND string NS is more than this in actuality, and may be freely set. The memory cell transistor MT includes a control gate electrode and a charge storage layer, and stores data in a non-volatile manner. The memory cell transistor MT is capable of storing 1-bit data or data of 2 bits or more.

Gates of a plurality of select transistors ST1 in the string unit SU0 are connected to a select gate line SGD0 in common, and similarly, select gate lines SGD1 to SGD3 are connected to the string units SU1 to SU3, respectively. Gates of a plurality of select transistors ST2 in the string unit SU0 are connected to a select gate line SGS0 in common, and similarly, select gate lines SGS1 to SGS3 are connected to the string units SU1 to SU3, respectively. A common select gate line SGS may be connected to the string units SU0 to SU3 in each block BLK. Control gates of the memory cell transistors MT0 to MT7 within each block BLK are connected to word lines WL0 to WL7, respectively.

Among the NAND strings NS arranged in a matrix shape within each block BLK, drains of the select transistors ST1 of the plurality of NAND strings NS in the same column are connected in common to any one of bit lines BL0 to BL(m−1). "m" represents an integer of 1 or more. Each bit line BL is connected to the plurality of blocks BLK in common, and is connected to one NAND string NS within each string unit SU in each of the plurality of blocks BLK. Sources of the plurality of select transistors ST2 in each block BLK are connected to a source line SL in common. The source line SL is connected to, for example, the plurality of blocks BLK in common.

Data of the plurality of memory cell transistors MT within each block BLK is, for example, collectively erased. Reading and writing are collectively performed with respect to the plurality of memory cell transistors MT connected in common to one word line WL provided in one string unit SU. A set of the memory cell transistors MT sharing a word line WL within one string unit SU is called a cell unit CU. A group of 1-bit data stored in each of the plurality of memory cell transistors MT in the cell unit CU is called a page. That is, a write operation and a read operation with respect to the cell unit CU are executed in page units.

The NAND string NS may include a dummy cell transistor. Specifically, for example, two dummy cell transistors (not illustrated) are connected in series between the select transistor ST2 and memory cell transistor MT0. For example, two dummy cell transistors (not illustrated) are connected in series between the memory cell transistor MT7 and the select transistor ST1. A plurality of dummy word lines are connected to gates of a plurality of dummy cell transistors, respectively. The structure of the dummy cell transistor is the same as the memory cell transistor. The dummy cell transistor is not configured to store data, but has a function of alleviating a disturbance applied to a memory cell transistor or a select transistor during a write operation or an erase operation.

[1-1-5] Stacked Structure of Block BLK

Figure 6:
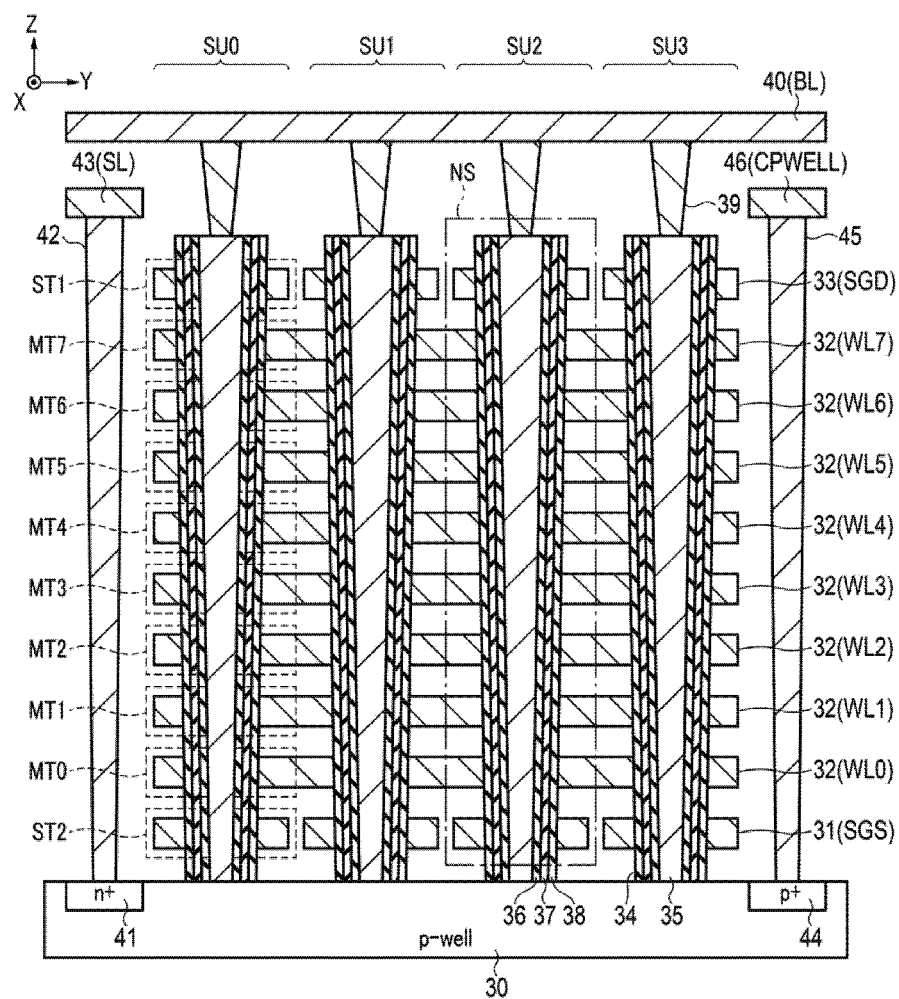
FIG. 6 is a sectional view of a partial area of a block.

FIG. 6 is a sectional view of a partial area of a block BLK. In FIG. 6, the X direction is a direction in which a select gate line extends, the Y direction perpendicular to the X direction within a horizontal plane is a direction in which a bit line extends, and the Z direction is a stacking direction.

A p-type well region (p-well) 30 is provided within a semiconductor layer. A plurality of NAND strings NS are provided on the p-type well region 30. That is, on the well region 30, a wiring layer 31 functioning as a select gate line SGS, eight wiring layers 32 functioning as word lines WL0 to WL7, and a wiring layer 33 functioning as a select gate line SGD are sequentially stacked with a plurality of insulating layers interposed therebetween. In order to avoid making the drawing complicated, hatching of the plurality of insulating layers provided between the plurality of stacked wiring layers is omitted.

A memory hole 34 extends to the well region 30 through the wiring layers 31, 32, and 33. A semiconductor layer 35 in a pillar shape (also referred to as a semiconductor pillar) is provided within the memory hole 34. A gate insulating film 36, a charge storage layer (which is an insulating film in one embodiment) 37 and a block insulating film 38 are sequentially provided on the side surface of the semiconductor pillar 35. These constitute a memory cell transistor MT, and select transistors ST1 and ST2. The semiconductor pillar 35 is a region functioning as a current path of the NAND string NS, in which each transistor channel is formed. The upper end of the semiconductor pillar 35 is connected to a metal wiring layer 40 functioning as a bit line BL via a contact plug 39.

An n+ type diffusion region 41 into which an n-type impurity at a high concentration is introduced is provided on the surface region of the well region 30. A contact plug 42 is provided on the diffusion region 41, and is connected to a metal wiring layer 43 functioning as a source line SL. A p+ type diffusion region 44 into which a p-type impurity at a high concentration is introduced is provided on the surface region of the well region 30. A contact plug 45 is provided on the diffusion region 44, and is connected to a metal wiring layer 46 functioning as a well wiring CPWELL. The well wiring CPWELL is a wiring that applies a voltage to the semiconductor pillar 35 via the well region 30.

A plurality of configurations as described above are arranged in the depth direction (the X direction) of the page of FIG. 6, and a set of the plurality of NAND strings NS arranged in the X direction constitutes a string unit SU.

[1-1-6] Threshold Voltage Distribution of Memory Cell Transistor

Figure 7:
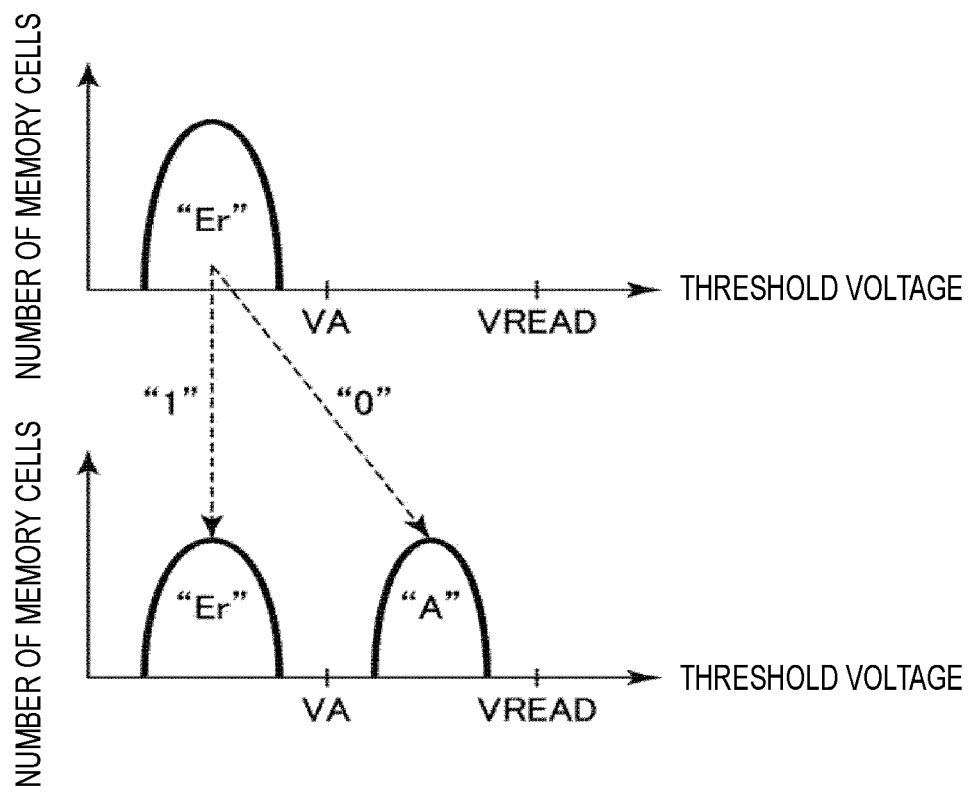
FIG. 7 is a schematic view illustrating an example of a threshold voltage distribution of memory cell transistors.

Next, descriptions will be made on a distribution of threshold voltages Vth that memory cell transistors MT may take. FIG. 7 is a schematic view illustrating an example of a threshold voltage distribution of memory cell transistors MT. The memory cell transistor MT is capable of storing 1-bit data. In the present embodiment, descriptions will be made on the case where the memory cell transistor MT stores 1-bit data, a so-called single level cell (SLC) mode, as an example.

When the memory cell transistor MT stores 1-bit data, the memory cell transistor MT may take any one of two states corresponding to threshold voltages. The two states are called states "Er," and "A" in order from the lowest. A plurality of memory cell transistors MT belonging to each of the states "Er," and "A" form a distribution.

For example, data "1," and "0" are assigned to the states "Er," and "A," respectively. In order to read data stored in the memory cell transistor MT as a read target, a state to which the threshold voltage of the corresponding memory cell transistor MT belongs is determined. For determination of the state, a read voltage VA is used.

The state "Er" corresponds to a state where data is erased (an erased state). The threshold voltage of the memory cell transistor MT belonging to the state "Er" is lower than a voltage VA, and has, for example, a negative value.

The state "A" corresponds to a state where charges are injected into a charge storage layer and data is written on the memory cell transistor MT. The threshold voltage of the memory cell transistor MT belonging to the state "A" has, for example, a positive value. The threshold voltage of the memory cell transistor MT belonging to the state "A" is higher than a read voltage VA, and lower than a voltage VREAD.

The voltage VREAD is a voltage applied to a word line WL connected to memory cell transistors MT of a cell unit CU as a non-read target, and is higher than a threshold voltage of the memory cell transistor MT placed in any state. That is, the memory cell transistor MT whose control gate electrode is applied with the voltage VREAD is placed in an ON state regardless of data to be stored.

As described above, each memory cell transistor MT is set to one of two states, and is capable of storing 1-bit data. Writing and reading are performed in units of pages within one cell unit CU.

[1-1-7] Configuration of Sense Amplifier Unit 28 and Data Register 29

Figure 8:
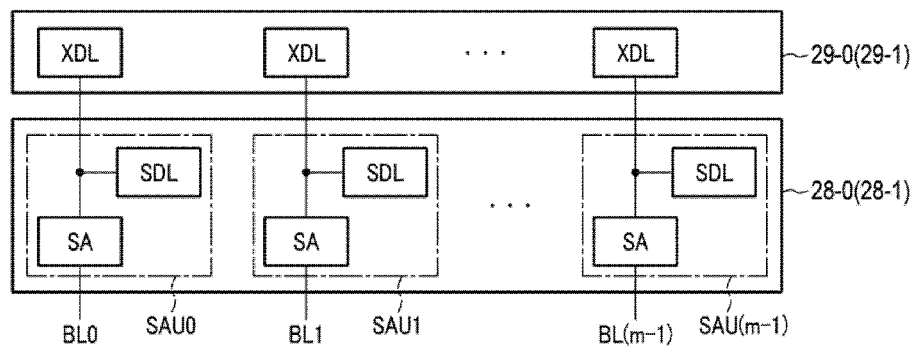
FIG. 8 is a block diagram of a sense amplifier unit and a data register illustrated in FIG. 4.

FIG. 8 is a block diagram of the sense amplifier unit 28-0 (28-1) and the data register 29-0 (29-1) illustrated in FIG. 4. The sense amplifier units 28-0 and 28-1 have the same configurations, and thus, in FIG. 8, the sense amplifier unit 28-0 is extracted and illustrated. Similarly, the data registers 29-0 and 29-1 have the same configurations, and thus, in FIG. 8, the data register 29-0 is extracted and illustrated.

The sense amplifier unit 28-0 includes sense amplifier units SAU0 to SAU (m−1) corresponding to bit lines BL0 to BL (m−1). Each sense amplifier unit SAU includes a sense amplifier SA, and a data latch circuit SDL. The sense amplifier SA and the data latch circuit SDL are connected to each other such that data may be transferable.

The data latch circuit SDL temporarily stores data. At the time of a write operation, the sense amplifier SA controls a voltage of a bit line BL according to data stored by the data latch circuit SDL. The number of data latch circuits in the sense amplifier unit SAU may be freely changed.

The sense amplifier SA, at the time of a read operation, detects data read to the corresponding bit line BL, and determines whether the data is data "0" or data "1." The sense amplifier SA, at the time of a write operation, applies a voltage to the bit line BL based on write data.

The data register 29-0 includes the same number of data latch circuits XDL as the sense amplifier units SAU0 to SAU (m−1). The data latch circuit XDL is connected to the input/output circuit 21. The data latch circuit XDL temporarily stores write data sent from the input/output circuit 21, and temporarily stores read data sent from the sense amplifier unit SAU. More specifically, data transfer between the input/output circuit 21 and the sense amplifier unit 28-0 is performed through the data latch circuits XDL for one page. The write data received by the input/output circuit 21 is transferred to the data latch circuit SDL via the data latch circuit XDL. The read data read by the sense amplifier SA is transferred to the input/output circuit 21 via the data latch circuit XDL.

That is, at the time of a normal read operation, in each sense amplifier unit SAU, the sense amplifier SA detects data read to the corresponding bit line BL and determines whether the data is data "0" or data "1," and the data latch circuit SDL stores the corresponding data. The data stored in the data latch circuit SDL is transferred to the corresponding data latch circuit XDL, and then transferred from the data latch circuit XDL to the input/output circuit 21.

At the time of a normal write operation, data input to the input/output circuit 21 is transferred to the data latch circuit XDL, and the corresponding data is transferred to the data latch circuit SDL of the sense amplifier unit SAU. The sense amplifier SA applies a voltage to the bit line BL based on the write data stored in the data latch circuit SDL.

[1-2] Operation

The operation of the memory system 1 configured as described above will be described.

[1-2-1] Data In Suspend Sequence

A Data In Suspend sequence according to the present embodiment will be described. The Data In Suspend sequence is a sequence in which data-in is suspended, and an operation other than a program operation, for example, a read operation, is executed during data-in (i.e., during a program sequence). The data-in is a processing of storing (buffering) data (for example, 8 bits at a time) sequentially input from the memory controller 3 to the NAND-type flash memory 2, in the data register 29. The present embodiment corresponds to an example according to a Single Plane Program in which one plane PB executes a program operation.

Figure 9:
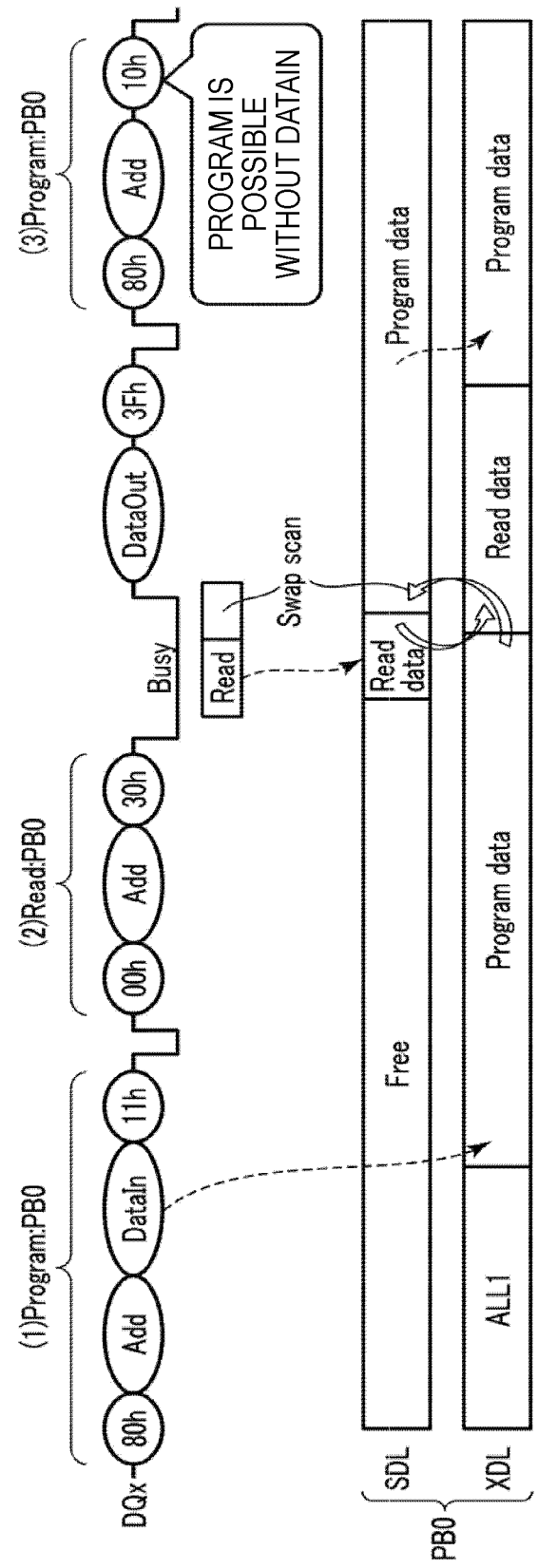
FIG. 9 is a timing chart for explaining a Data In Suspend sequence according to the first embodiment.

FIG. 9 is a timing chart for explaining the Data In Suspend sequence according to the first embodiment. FIG. 9 is an example in which, for example, the plane PB0 executes a program operation. FIG. 9 illustrates a command sequence transferred via a DQx line, and data stored by latch circuits SDL and XDL corresponding to the plane PB0 along the time flow of the command sequence. A rectangular waveform written over the command sequence indicates a ready/busy signal RBn.

At an initial state, the latch circuit SDL is placed in a free state, and the latch circuit XDL stores, for example, data "1." In FIG. 9, a state where all the latch circuits XDL store data "1" is denoted as "ALL1." A timing when the latch circuit XDL is to be reset (set to "ALL1") is a time, for example, when the NAND-type flash memory 2 receives an input command "80h" to be described below from the memory controller 3.

First, the memory controller 3 executes a program command with respect to the NAND-type flash memory 2. That is, the memory controller 3 issues the input command "80h," an address Add for the plane PB0, data (DataIn) and a multi-program command "11h", to the NAND-type flash memory 2 (step (1) in FIG. 9). When receiving the corresponding command sequence, the control circuit 24 temporarily sets the signal RBn to a low level (busy state) and executes a data-in processing, that is, a processing of transferring program data to the latch circuit XDL.

Subsequently, the memory controller 3 suspends a program operation. Then, the memory controller 3 executes a read command with respect to the NAND-type flash memory 2. That is, the memory controller 3 issues a first read command "00h," an address Add for the plane PB0, and a second read command "30h" to the NAND-type flash memory 2 (step (2) in FIG. 9). When receiving the corresponding command sequence, the control circuit 24 temporarily sets the signal RBn to a low level and executes a read operation.

In the read operation, read data read from the plane PB0 is stored in the latch circuit SDL. Subsequently, the control circuit 24 executes a processing (referred to as swap-scan) of exchanging data of the latch circuit SDL and data of the latch circuit XDL. Details of the swap-scan will be described below. Accordingly, the program data transferred from the input/output circuit 21 to the latch circuit XDL is saved in the latch circuit SDL, and the read data is stored in the latch circuit XDL. As a result, it is possible to prevent the program data transferred from the input/output circuit 21 to the latch circuit XDL from being destroyed (overwritten) by the read data. Subsequently, the control circuit 24 outputs the read data (DataOut) stored in the latch circuit XDL, to the memory controller 3.

Subsequently, the memory controller 3 issues a transfer command "3Fh" to the NAND-type flash memory 2. In response to the transfer command "3Fh," the control circuit 24 transfers the program data stored in the latch circuit SDL, to the latch circuit XDL.

During suspension of data-in, the memory controller 3 may continuously execute a plurality of read commands with respect to the NAND-type flash memory 2. Specifically, the memory controller 3 may continuously execute a sequence from the first read command "00h" to the transfer command "3Fh."

Subsequently, the memory controller 3 executes a program command with respect to the NAND-type flash memory 2. That is, the memory controller 3 issues the input command "80h," an address Add for the plane PB0, and an auto program command "10h" to the NAND-type flash memory 2 (step (3) in FIG. 9). Here, as illustrated in FIG. 9, the program data is already stored in the latch circuit XDL. Accordingly, the program data is not included in the second program command sequence.

Thereafter, the control circuit 24 transfers the program data stored in the latch circuit XDL, to the latch circuit SDL, and executes the program operation. Accordingly, the program data stored in the latch circuit XDL is written on the plane PB0.

The memory controller 3 is capable of outputting the data stored in the latch circuit XDL at any timing. Specifically, the memory controller 3 issues a first data output command "05h," a column address, and a second data output command "E0," to the NAND-type flash memory 2. In response to the corresponding command sequence, the NAND-type flash memory 2 outputs the data stored in the latch circuit XDL to the memory controller 3.

Figure 10:
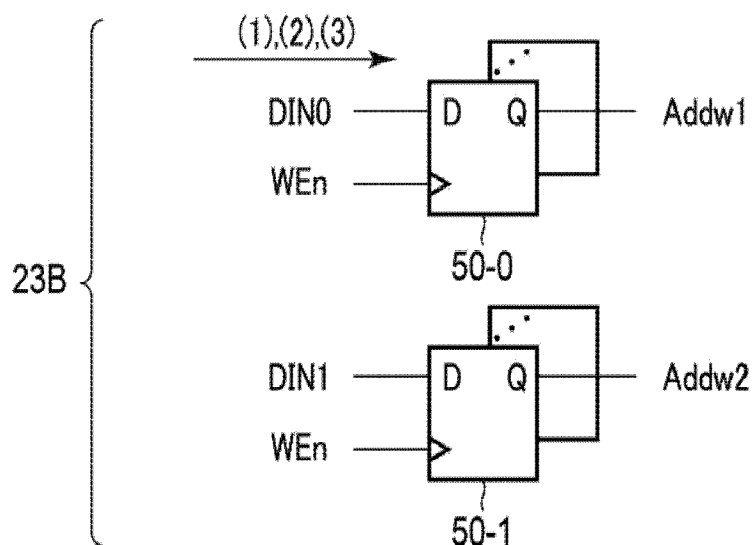
FIG. 10 is a view for explaining an operation of an address register illustrated in FIG. 2.

FIG. 10 is a view for explaining an operation of the address register 23B illustrated in FIG. 2. The address register 23B includes a latch circuit group 50-0 for the plane PB0, and a latch circuit group 50-1 for the plane PB1. Each of the latch circuit groups 50-0 and 50-1 includes the same number of latch circuits as bits of an address. The latch circuit groups 50-0 and 50-1 are used to store a row-type address (row address).

The latch circuit group 50-0 includes an input terminal D connected to an input line DIN0, an output terminal Q, and a clock terminal to which a write enable signal WEn is input. The latch circuit group 50-0 latches input data when the signal input to the clock terminal is asserted. The latch circuit group 50-0 outputs a row address Addw1 for the plane PB0.

The latch circuit group 50-1 includes an input terminal D connected to an input line DIN1, an output terminal Q, and a clock terminal to which a write enable signal WEn is input. The latch circuit group 50-1 latches input data when the signal input to the clock terminal is asserted. The latch circuit group 50-1 outputs a row address Addw2 for the plane PB1.

The numbers (1), (2), and (3) in FIG. 10 correspond to the steps (1), (2), and (3) in FIG. 9, and in this order, addresses are input to the latch circuit group 50. In the present embodiment, addresses are separately input in the three command sequences corresponding to the steps (1), (2), and (3), respectively. Therefore, the address register 23B is capable of storing an address corresponding to a processing being executed each time.

[1-2-2] Swap-Scan

Figure 11:
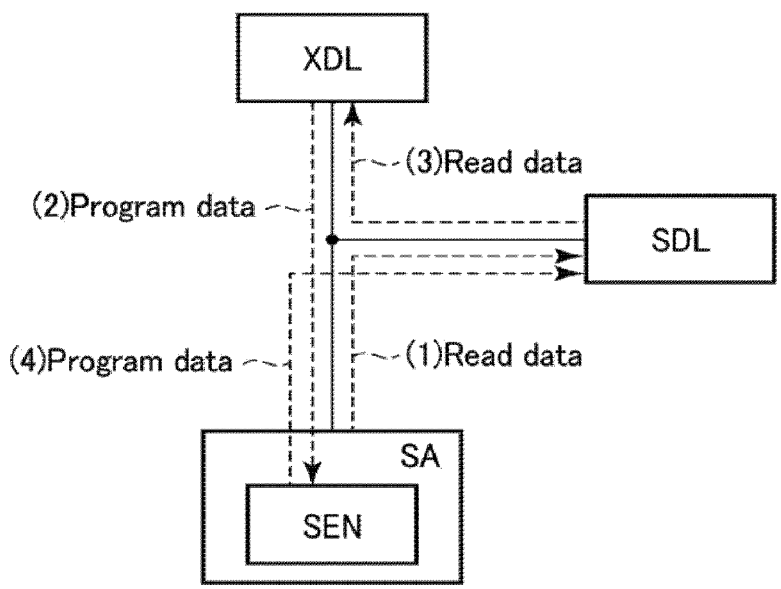
FIG. 11 is a schematic view for explaining swap-scan.

Hereinafter, the above-described swap-scan will be described. FIG. 11 is a schematic view for explaining swap-scan. FIG. 11 illustrates the sense amplifier SA, and the latch circuits SDL and XDL.

The sense amplifier SA includes a storage node SEN used for detecting data of a bit line BL. The storage node SEN has a capacity, and is capable of temporarily storing a voltage transferred from the bit line. In the swap-scan, the storage node SEN is used as a temporary latch that stores data. The control circuit 24 transfers read data read by the sense amplifier SA, to the latch circuit SDL (step (1) in FIG. 11).

As illustrated in FIG. 9, the latch circuit XDL stores program data. The control circuit 24 transfers the program data stored by the latch circuit XDL to the storage node SEN of the sense amplifier SA (step (2) in FIG. 11).

Subsequently, the control circuit 24 transfers read data stored by the latch circuit SDL, to the latch circuit XDL (step (3) in FIG. 11).

Subsequently, the control circuit 24 transfers the program data stored by the storage node SEN of the sense amplifier SA to the latch circuit SDL (step (4) in FIG. 11).

Through such swap-scan, it is possible to exchange data of the latch circuit SDL with data of the latch circuit XDL without losing the program data and the read data.

[1-2-3] Comparative Example

Figure 12:
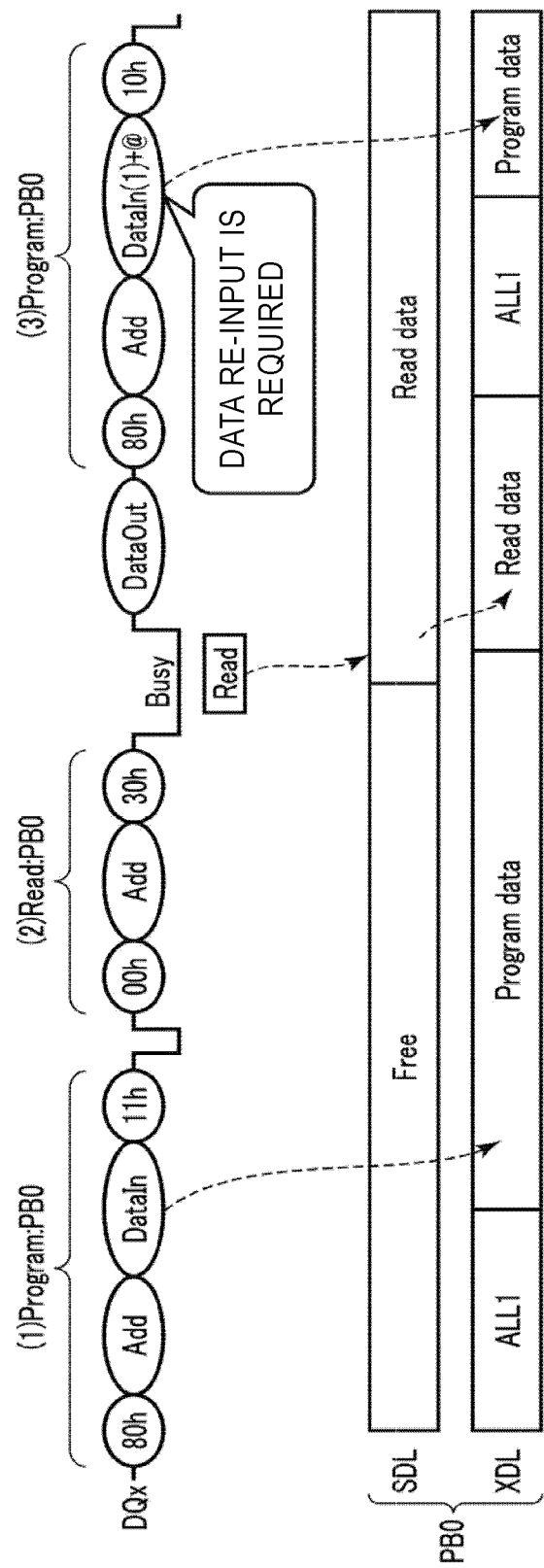
FIG. 12 is a timing chart for explaining a Data In Suspend sequence according to a Comparative Example.

Hereinafter, descriptions will be made on a Data In Suspend sequence according to a Comparative Example. FIG. 12 is a timing chart for explaining the Data In Suspend sequence according to the Comparative Example.

First, the memory controller 3 executes a program command with respect to the NAND-type flash memory 2 (step (1) in FIG. 12).

Subsequently, the memory controller 3 suspends a program operation. Then, the memory controller 3 executes a read command with respect to the NAND-type flash memory 2 (step (2) in FIG. 12).

In a read operation, read data read from the plane PB0 is stored in the latch circuit SDL, and subsequently, is transferred from the latch circuit SDL to the latch circuit XDL. At this point in time, the program data stored in the latch circuit XDL is destroyed (overwritten). Then, the read data (DataOut) stored in the latch circuit XDL is output to the memory controller 3.

Subsequently, the memory controller 3 issues an input command "80h," an address Add for the plane PB0, data (DataIn(1)+α), and an auto program command "10h" with respect to the NAND-type flash memory 2 (step (3) in FIG. 12). "DataIn(1)+α" indicates that the same data as the program data in the first program command sequence is included together with dataα as separate data. Then, the program data stored in the latch circuit XDL is written on the plane PB0.

In the Comparative Example, after the read operation, the program data is lost. Thus, it becomes required to re-input data in the second program command sequence. This prolongs a writing time.

[1-3] Effect of First Embodiment

As described above in detail, in the first embodiment, after issuing a program command with respect to the NAND-type flash memory 2, the memory controller 3 suspends a program operation related to the program command and executes a read command. The control circuit 24 of the NAND-type flash memory 2 continuously receives a first program command, and a read command from the outside. While the latch circuit XDL stores program data input together with the first program command, and the latch circuit SDL stores read data read in response to the read command, the control circuit 24 exchanges the read data of the latch circuit SDL with the program data of the latch circuit XDL. The control circuit 24 outputs the read data of the latch circuit XDL to the outside. Then, when receiving a transfer command from the outside, the control circuit 24 transfers the program data of the latch circuit SDL to the latch circuit XDL.

Therefore, according to the first embodiment, in a sequence in which the program operation is suspended and the read operation is performed, it becomes possible to store program data in the NAND-type flash memory 2. Therefore, when the program operation is resumed after suspension, there is no need to input the program data again. As a result, it is possible to provide the NAND-type flash memory 2 and the memory system 1 whose performance is improvable in the sequence in which the program operation is suspended and the read operation is performed.

When the program operation is resumed, an address for program is input again. Therefore, it is possible for the address register 23B to store an address corresponding to a processing being executed each time without changing a configuration of the address register 23B.

In the first embodiment, descriptions are made on an example in which after program data for one page is transmitted from the memory controller 3 to the NAND-type flash memory 2, an execution instruction of a read command is made. However, the present disclosure is not limited thereto. After data up to the middle of program data for one page is transmitted from the memory controller 3 to the NAND-type flash memory 2, an execution instruction of a read command may be made. In this case as well, when a program operation is resumed, it is not necessary to re-input data transmitted to the NAND-type flash memory 2 before the execution instruction of the read command is made, but only the remaining data need to be transmitted to the NAND-type flash memory 2.

Figure 13A:
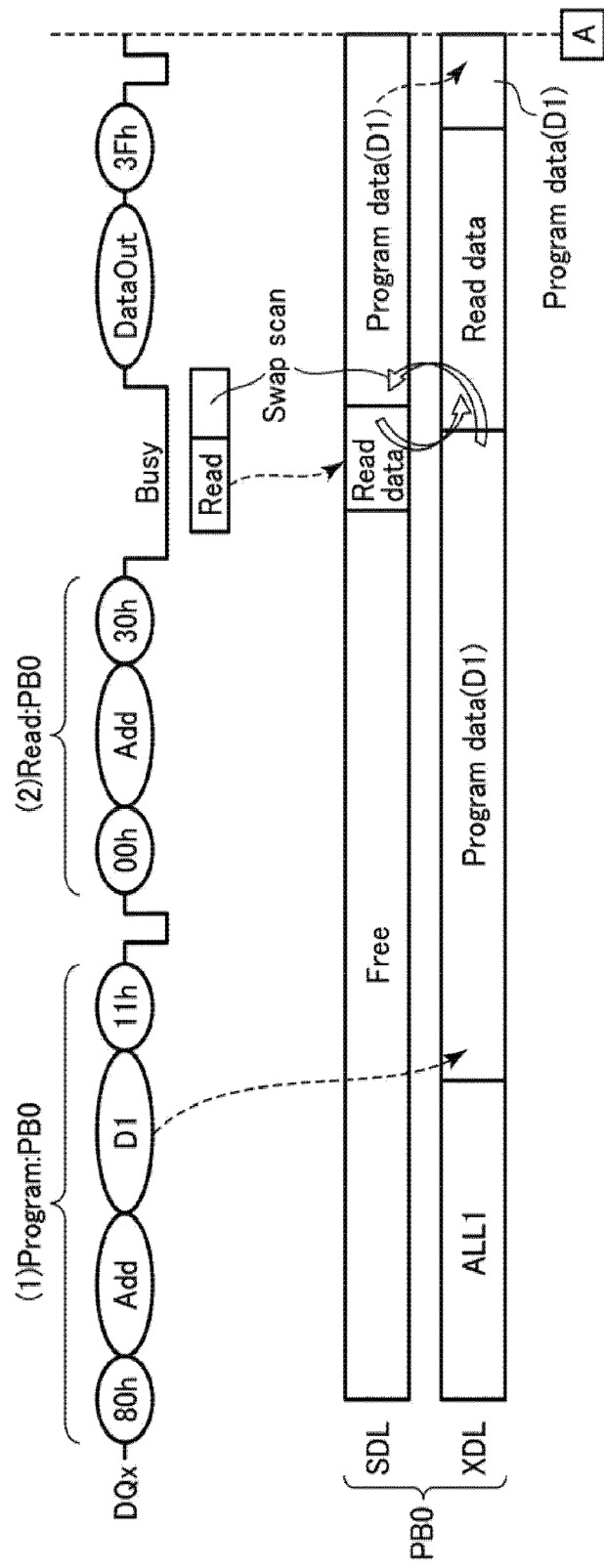
FIG. 13A is a timing chart for explaining a Data In Suspend sequence according to a modification.
Figure 13B:
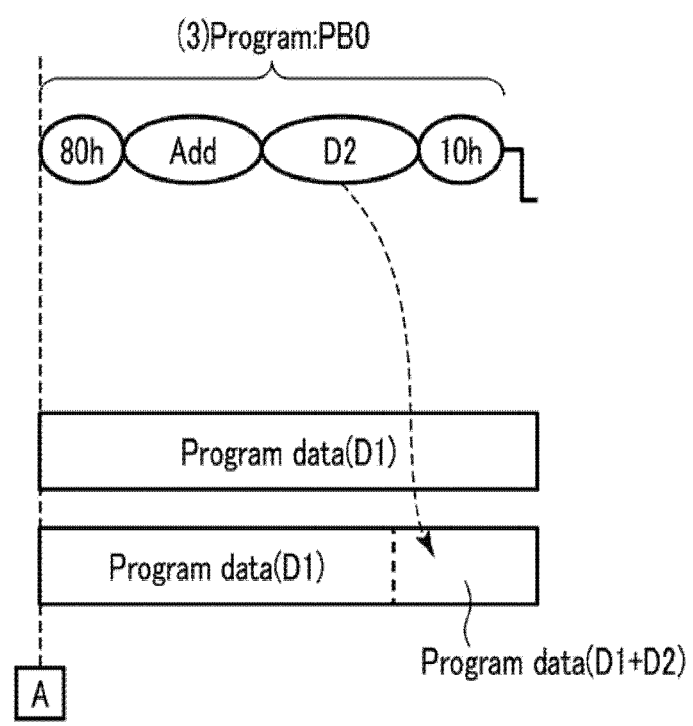
FIG. 13B is a timing chart for explaining the Data In Suspend sequence according to the modification.

FIGS. 13A and 13B illustrate an example in which after program data D1 for a part of one page (for example, for ⅝ page) is transmitted from the memory controller 3 to the NAND-type flash memory 2, an execution instruction of a read command is made. In this case as well, the program data D1 stored in the latch circuit XDL is saved in the latch circuit SDL at the time of a read operation, and then is transferred from the latch circuit SDL to the latch circuit XDL by a transfer command after the read operation ends. Accordingly, when a write operation is resumed, since the program data D1 for ⅝ page is already stored in the latch circuit XDL, it is possible to execute writing of program data "D1+D2" for one page only by inputting the remaining program data D2 for ⅜ page.

When the execution instruction of the read command is made after the program data D1 corresponding to a part of one page is transmitted, the program data D1 is stored in a part of latch circuits XDL for one page in the data register 29. Therefore, it is required to store the remaining program data D2 in a remaining part of the latch circuits XDL for one page in the data register 29. For example, by designating a column address in an address Add transmitted from the memory controller 3 to the NAND-type flash memory 2, it is possible to designate the latch circuit XDL to store the remaining program data D2. When the execution instruction of the read command is made after the program data D1 corresponding to a part of one page is transmitted, the memory controller 3 stores information on a column address of the latch circuit XDL in which the corresponding program data D1 is stored, in an internal register (not illustrated). Therefore, when transmitting the remaining program data D2 to the NAND-type flash memory 2, the memory controller 3, based on this information, may designate a proper column address in the address Add to store the remaining program data D2 in the latch circuit XDL in which data is not yet stored.

According to the first embodiment, in the case where after a part of program data for one page is transmitted, an execution instruction of a read command is made and then a write operation is resumed, it is possible to execute the write operation based on the program data for one page only by transmitting the remaining data.

[2] Second Embodiment

In a second embodiment, a latch circuit that stores an address for program, and a latch circuit that stores an address for reading are separately provided. Then, re-input of an address is omitted so that a command sequence may be further simplified.

[2-1] Configuration of Address Register 23B

Figure 14:
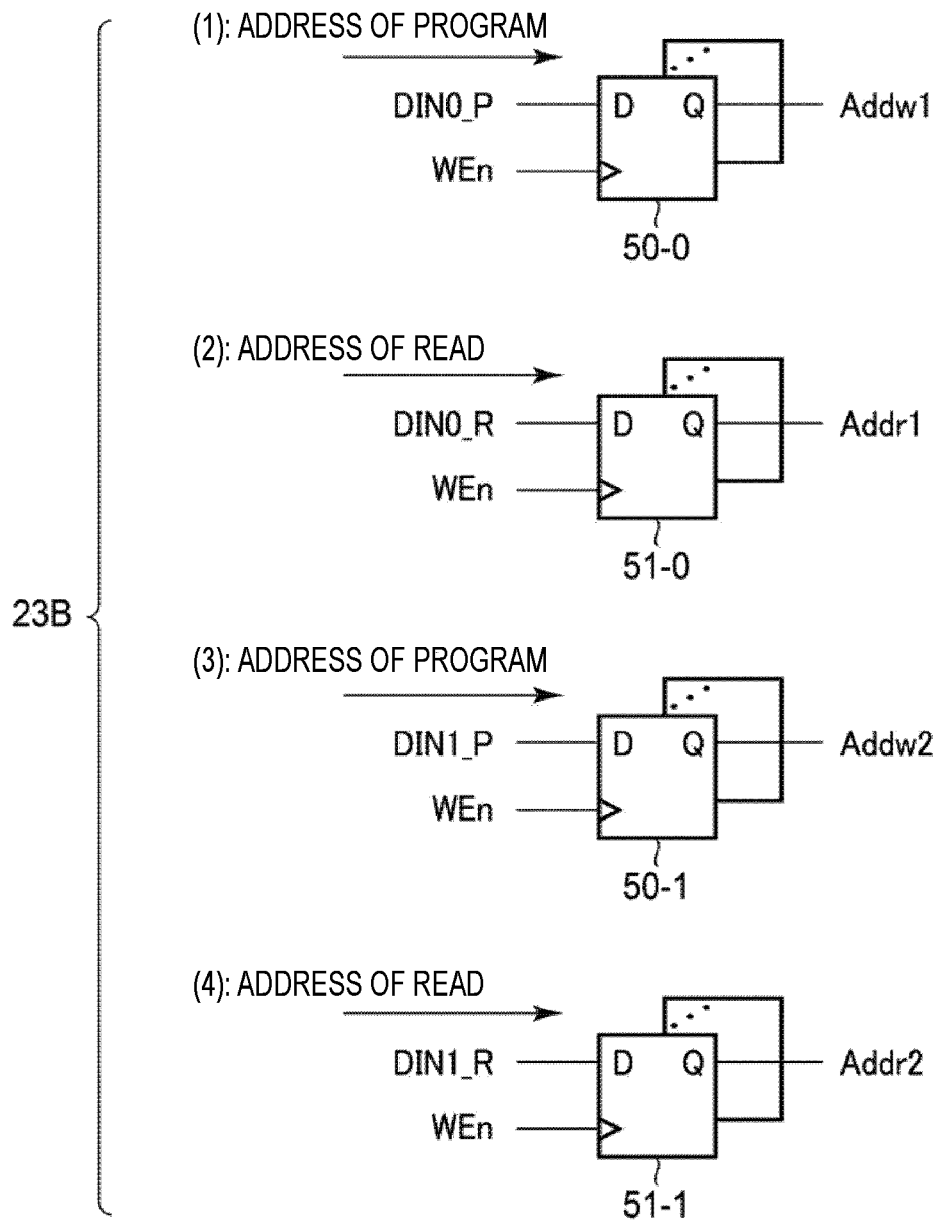
FIG. 14 is a circuit diagram of an address register according to a second embodiment.

FIG. 14 is a circuit diagram of the address register 23B. The address register 23B includes latch circuit groups 50-0, 50-1, 51-0, and 51-1. The latch circuit group 50-0 stores a row address for the plane PB0 and program. The latch circuit group 51-0 stores a row address for the plane PB0 and reading. The latch circuit group 50-1 stores a row address for the plane PB1 and program. The latch circuit group 51-1 stores a row address for the plane PB1 and reading.

The latch circuit group 50-0 includes an input terminal D connected to an input line DIN0_P, an output terminal Q, and a clock terminal to which a write enable signal WEn is input. The latch circuit group 50-0 outputs a row address Addw1 for the plane PB0 and program.

The latch circuit group 51-0 includes an input terminal D connected to an input line DIN0_R, an output terminal Q, and a clock terminal to which a write enable signal WEn is input. The latch circuit group 51-0 outputs a row address Addr1 for the plane PB0 and reading.

The latch circuit group 50-1 includes an input terminal D connected to an input line DIN1_P, an output terminal Q, and a clock terminal to which a write enable signal WEn is input. The latch circuit group 50-1 outputs a row address Addw2 for the plane PB1 and program.

The latch circuit group 51-1 includes an input terminal D connected to an input line DIN1_R, an output terminal Q, and a clock terminal to which a write enable signal WEn is input. The latch circuit group 51-1 outputs a row address Addr2 for the plane PB1 and reading.

The address register 23B configured as described above may separately store (1) a row address for the plane PB0 and program, (2) a row address for the plane PB0 and reading, (3) a row address for the plane PB1 and program, and (4) a row address for the plane PB1 and reading.

[2-2] Data In Suspend Sequence

Figure 15:
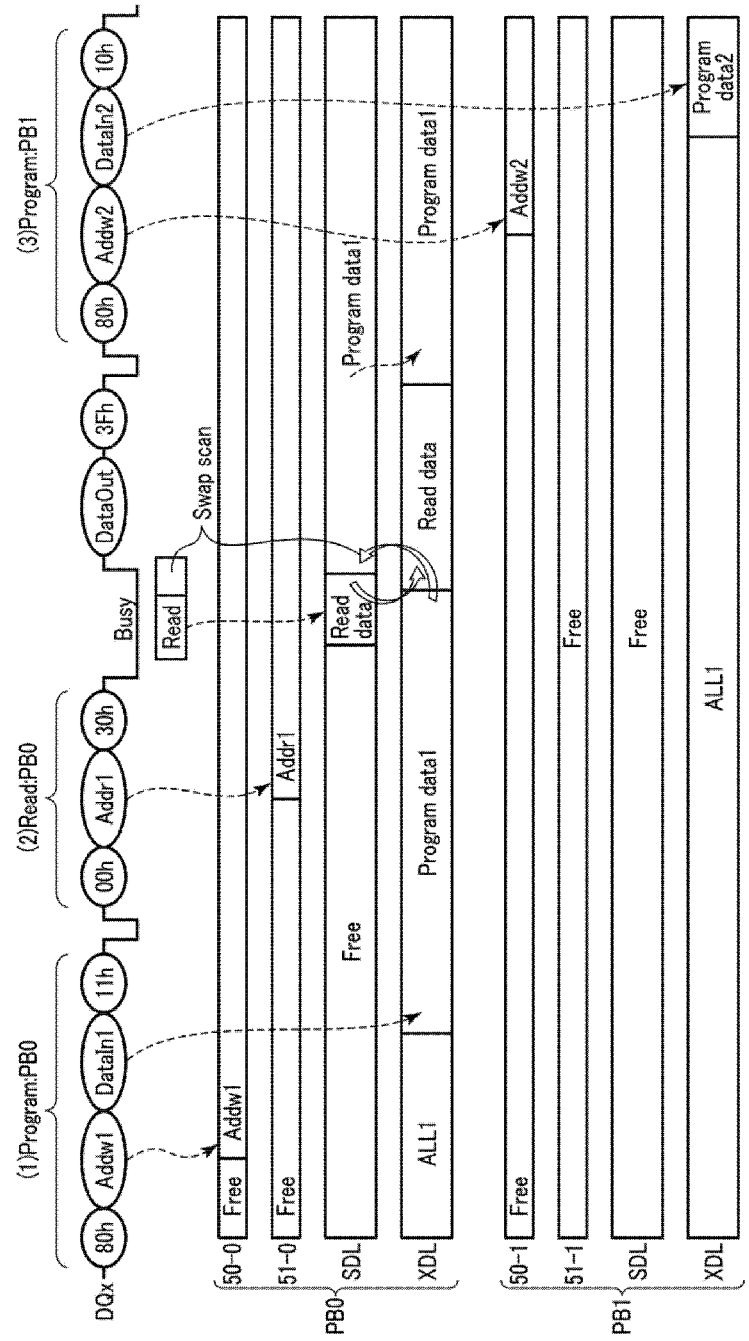
FIG. 15 is a timing chart for explaining a Data In Suspend sequence according to the second embodiment.

FIG. 15 is a timing chart for explaining a Data In Suspend sequence according to the second embodiment. The present embodiment corresponds to an example according to a Multi-Plane Program in which two planes PB execute a program operation in parallel with each other.

First, the memory controller 3 issues an input command "80h," an address Addw1 for the plane PB0, data (DataIn1), and a multi-program command "11h" with respect to the NAND-type flash memory 2 (step (1) in FIG. 15). A row address for the plane PB0 and program is stored in the latch circuit group 50-0 of the address register 23B.

Subsequently, the memory controller 3 suspends a program operation. Then, the memory controller 3 issues a first read command "00h," an address Addr1 for the plane PB0, and a second read command "30 h" with respect to the NAND-type flash memory 2 (step (2) in FIG. 15). A row address for the plane PB0 and reading is stored in the latch circuit group 51-0 of the address register 23B.

At this point in time, the row address for the plane PB0 and program is stored in the latch circuit group 50-0. Thus, the memory controller 3 does not need to issue the corresponding address again.

Subsequently, the memory controller 3 issues a transfer command "3Fh" with respect to the NAND-type flash memory 2.

Subsequently, the memory controller 3 executes a program command with respect to the plane PB1. That is, the memory controller 3 issues an input command "80h," an address Addw2 for the plane PB1, data (DataIn2) and an auto program command "10h" with respect to the NAND-type flash memory 2 (step (3) in FIG. 15). A row address for the plane PB1 and program is stored in the latch circuit group 50-1 of the address register 23B.

At this point in time, with respect to the planes PB0 and PB1, program data is assorted in the data register 29. In response to the auto program command "10h," the control circuit 24 executes a program operation with respect to the planes PB0 and PB1 in parallel.

[2-3] Comparative Example

Figure 16:
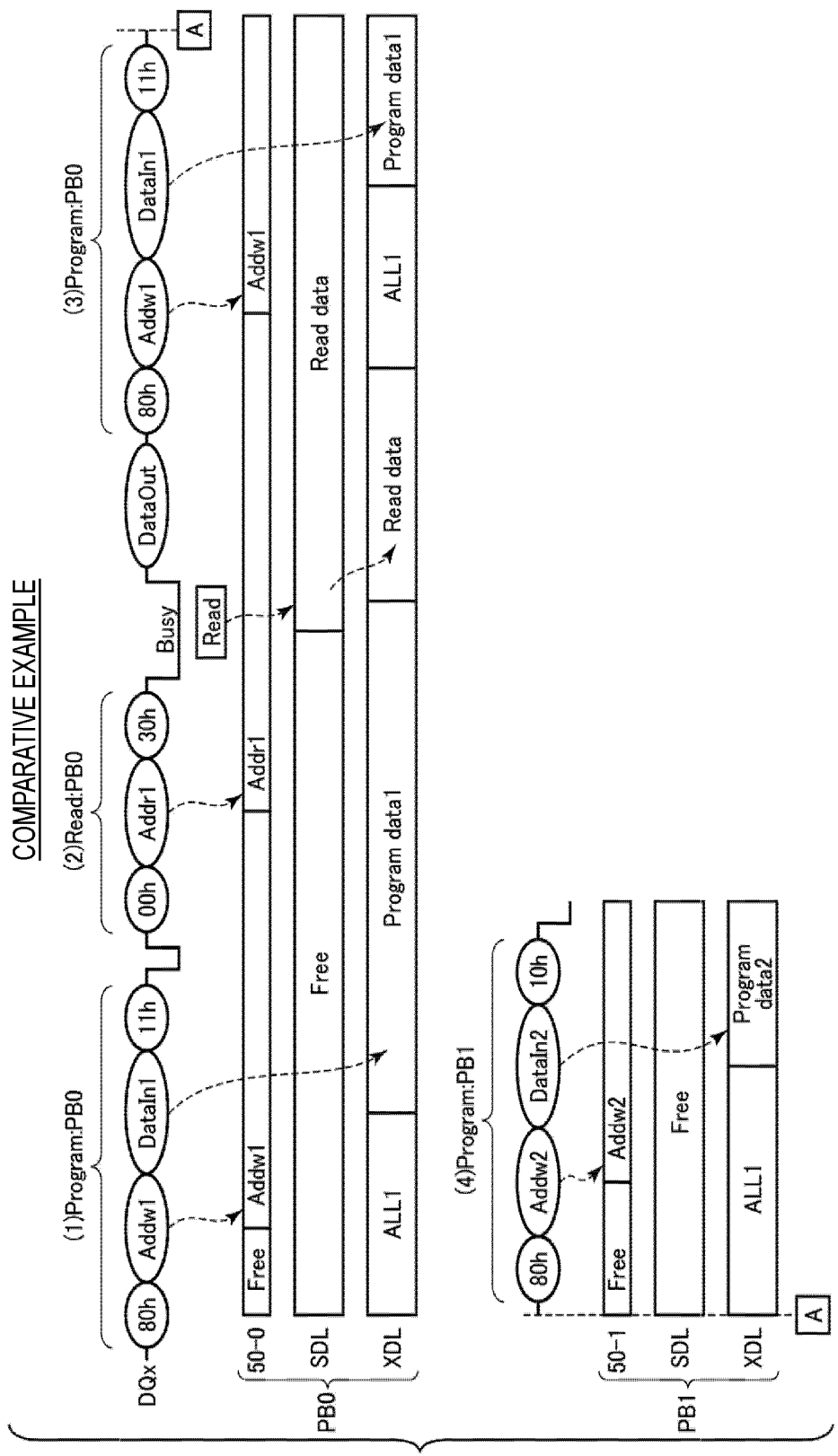
FIG. 16 is a timing chart for explaining a Data In Suspend sequence according to a comparative example.

Hereinafter, descriptions will be made on a Data In Suspend sequence according to a Comparative Example. FIG. 16 is a timing chart for explaining the Data In Suspend sequence according to the Comparative Example. In the Comparative Example, the address register 23B includes a latch circuit group 50-0 for the plane PB0, and a latch circuit group 50-1 for the plane PB1. That is, in the Comparative Example, it is not possible to store simultaneously a row address for program and a row address for reading in the same plane PB.

The memory controller 3 sequentially executes a program command (step (1) in FIG. 16), and a read command (step (2) in FIG. 16), with respect to the plane PB0. At this point in time, a row address corresponding to the program command is not stored in the address register 23B. Program data, which was stored in the latch circuit XDL, is destroyed.

Subsequently, the memory controller 3 issues an input command "80h," an address Addw1 for the plane PB0, data (DataIn1), and a multi-program command "11h" with respect to the NAND-type flash memory 2 (step (3) in FIG. 16).

Subsequently, the memory controller 3 issues an input command "80h," an address Addw2 for the plane PB1, data (DataIn2), and an auto program command "10h" with respect to the NAND-type flash memory 2 (step (4) in FIG. 16).

At this point in time, with respect to the planes PB0 and PB1, program data is assorted in the data register 29. In response to the auto program command "10h," the control circuit 24 executes a program operation with respect to the planes PB0 and PB1 in parallel.

In the Comparative Example, as compared to the present embodiment, a program command sequence (step (3) in FIG. 16), in surplus, is added. Thus, in the Comparative Example, as compared to the present embodiment, a sequence of the Multi-Plane Program is prolonged.

[2-4] Effect of Second Embodiment

According to the second embodiment, in a sequence in which a program operation is suspended and a read operation is performed, the address register 23B may simultaneously store a row address for program, and a row address for reading that is input thereafter. Therefore, when the program operation is resumed, there is no need to re-input a row address for program. As a result, it is possible to provide the NAND-type flash memory 2 and the memory system 1 whose performance is further improvable.

[3] Third Embodiment

In the third embodiment, for example, program data for the plane PB0 is saved in a latch circuit XDL for the plane PB1 in the background of a read operation. Then, after the read operation ends, the program data stored in the latch circuit XDL for the plane PB1 is returned to a latch circuit XDL for the plane PB0.

[3-1] Configuration of Peripheral Circuits of Data Registers 29-0 and 29-1

Figure 17:
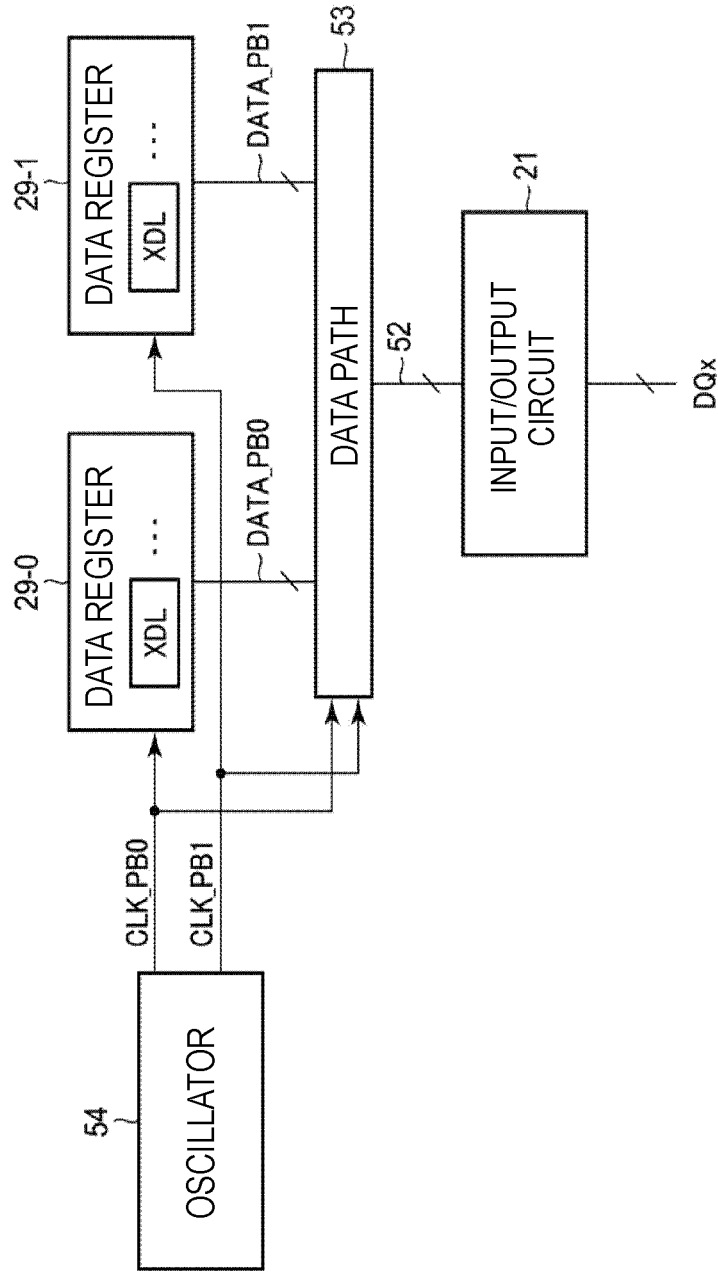
FIG. 17 is a block diagram in which peripheral circuits of data registers according to a third embodiment are extracted.

FIG. 17 is a block diagram in which peripheral circuits of the data registers 29-0 and 29-1 are extracted. As described above, the data register 29-0 is provided for the plane PB0, and the data register 29-1 is provided for the plane PB1.

The data register 29-0 is connected to a data path 53 via a bus DATA PB0. The data register 29-1 is connected to the data path 53 via a bus DATA PB1. The data registers 29-0 and 29-1 are connected to each other by the data path 53.

The data path 53 is connected to the input/output circuit 21 via a bus 52. The data path 53 includes a plurality of filp-flops (not illustrated).

An oscillator 54 generates a clock CLK PB0 for the plane PB0 and a clock CLK PB1 for the plane PB1, based on a control by the control circuit 24. The clock CLK PB0 is supplied to the data register 29-0 and the data path 53, and the clock CLK PB1 is supplied to the data register 29-1 and the data path 53. The oscillator 54 controls a latch operation of the data register 29-0 and the data path 53 using the clock CLK PB0, and controls a latch operation of the data register 29-1 and the data path 53 using the clock CLK PB1.

Figure 18:
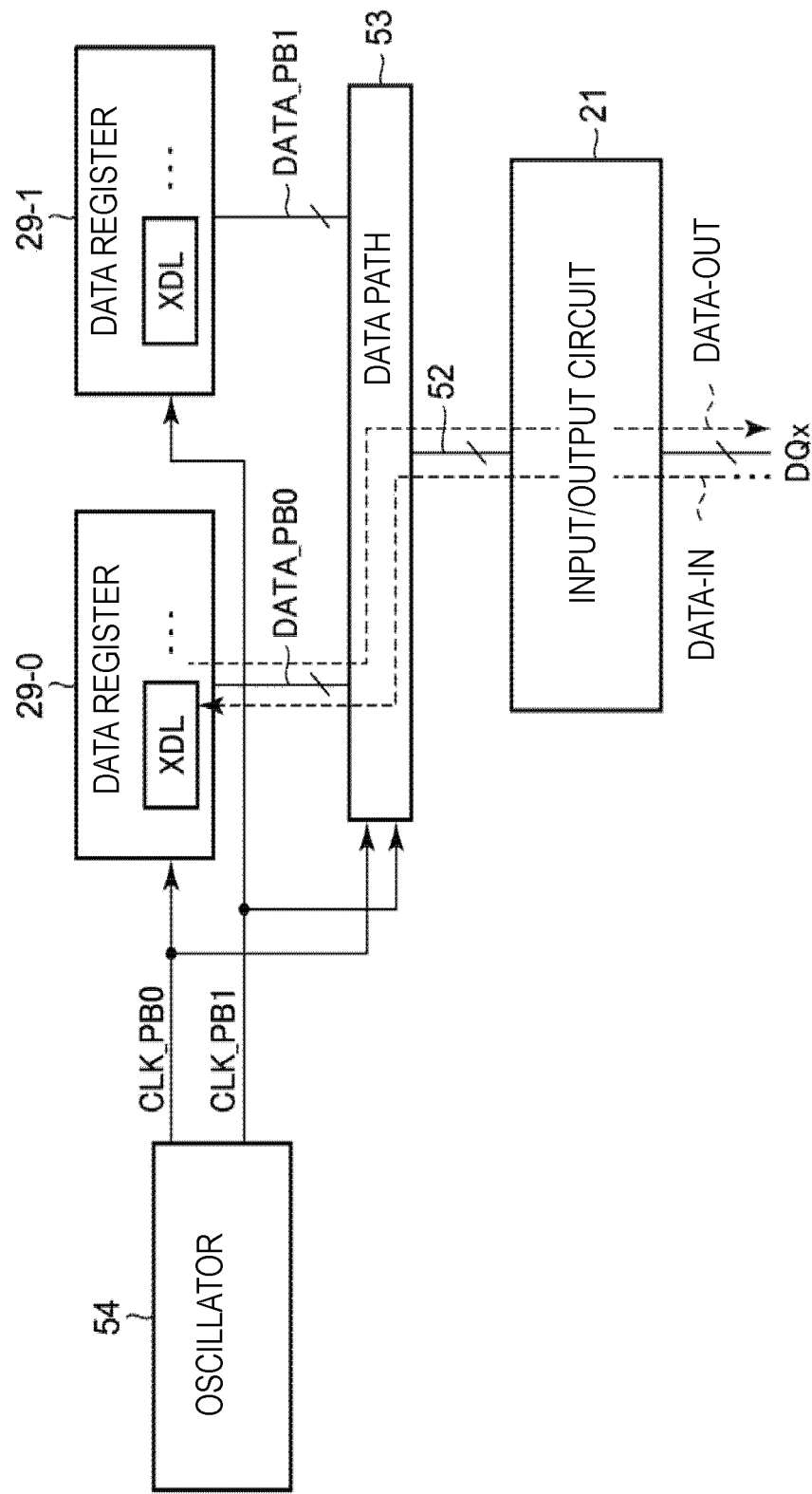
FIG. 18 is a view for explaining a data-in processing and a data-out processing.

FIG. 18 is a view for explaining a data-in processing and a data-out processing.

In the data-in processing, input data input to a DQx line is input to the data path 53 via the input/output circuit 21. The data path 53 transfers the input data to, for example, the data register 29-0 using the clock CLK PB0. In response to the clock CLK PB0, the data register 29-0 latches the input data.

In the data-out processing, in response to the clock CLK PB0, the data register 29-0 outputs the stored data. The data path 53 transfers the output data output from the data register 29-0 to the input/output circuit 21 using the clock CLK PB0.

Figure 19:
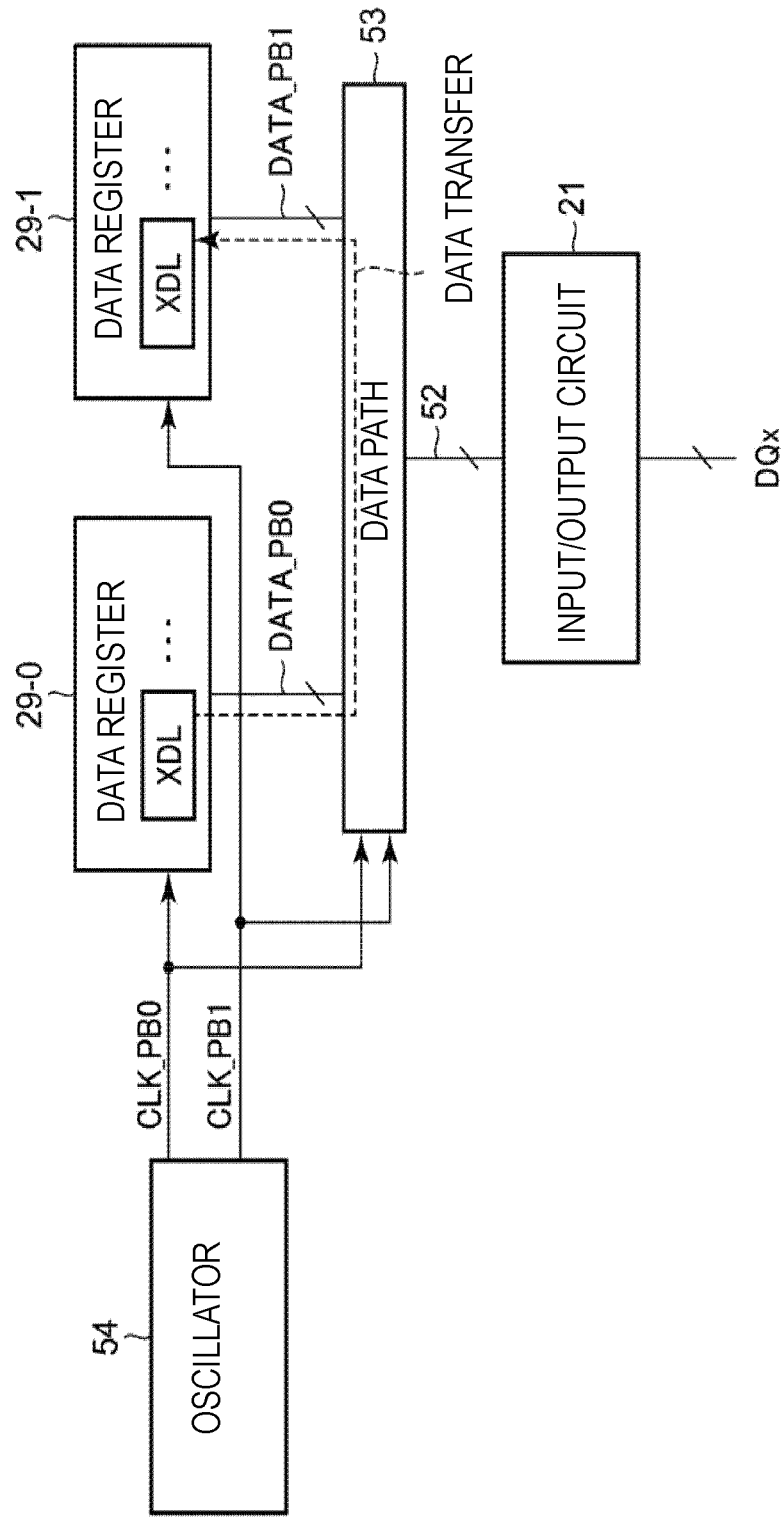
FIG. 19 is a view for explaining a data transfer processing between the data registers.

FIG. 19 is a view for explaining a data transfer processing between the data registers 29-0 and 29-1. For example, it is assumed that data is transferred from the data register 29-0 to the data register 29-1.

In response to the clock CLK PB0, the data register 29-0 outputs the stored data. The output data output from the data register 29-0 is input to the data path 53. The data path 53 transfers the data output from the data register 29-0 to the data register 29-1 using the clocks CLK PB0, and CLK PB1. In response to the clock CLK PB1, the data register 29-1 latches the output data transferred from the data path 53.

[3-2] Data In Suspend Sequence

Figure 20:
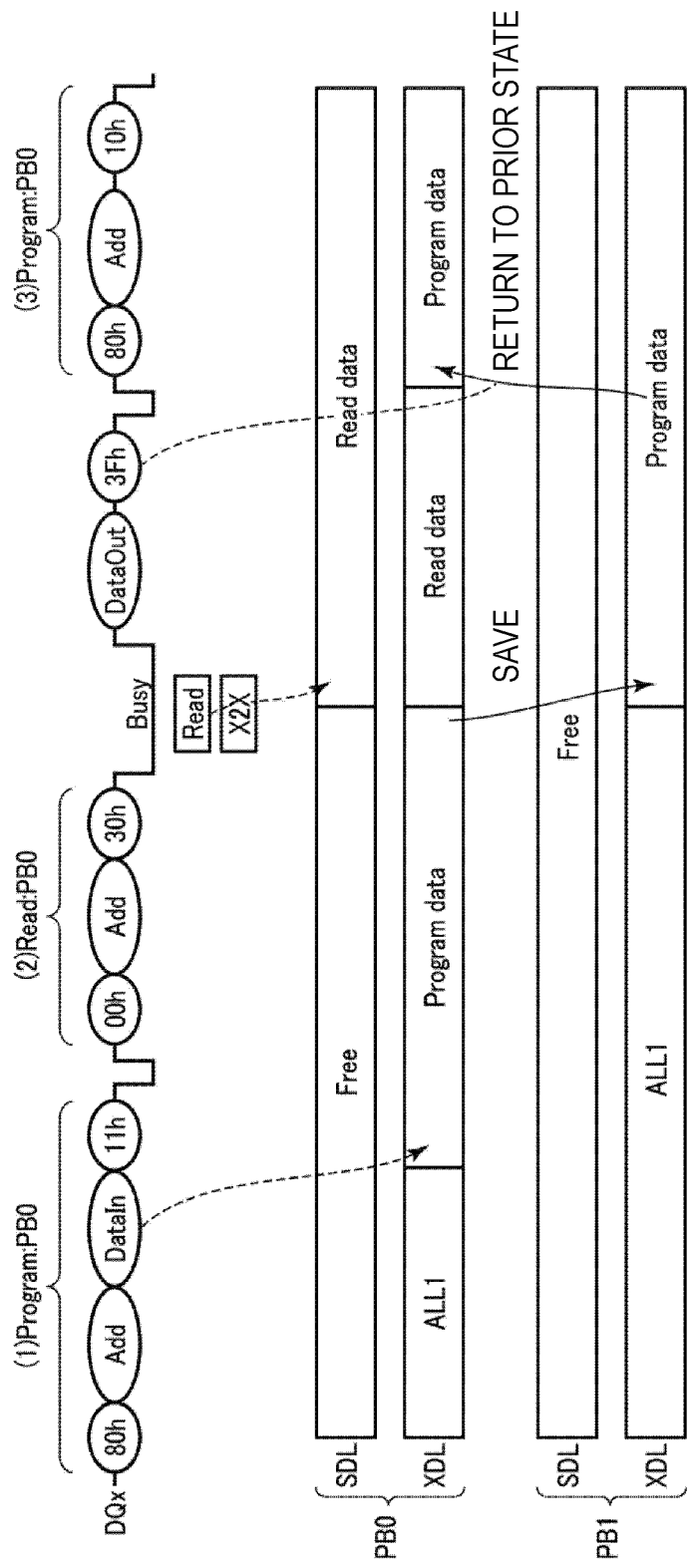
FIG. 20 is a timing chart for explaining a Data In Suspend sequence according to the third embodiment.

FIG. 20 is a timing chart for explaining a Data In Suspend sequence according to the third embodiment.

As in the first embodiment, the memory controller 3 executes a program command with respect to the NAND-type flash memory 2 (step (1) in FIG. 20), and subsequently, executes a read command (step (2) in FIG. 20).

When receiving a read command sequence, the control circuit 24 temporarily sets the signal RBn to a low level and executes a read operation. In the read operation, read data read from the plane PB0 is stored in the latch circuit SDL.

In parallel with the read operation, the control circuit 24 executes a data transfer processing ("XDL to XDL(X2X)" in FIG. 20) between the data registers 29-0 and 29-1. Accordingly, program data stored in the data register 29-0 (the latch circuit XDL for the plane PB0) is saved in the data register 29-1 (the latch circuit XDL for the plane PB1). Subsequently, the control circuit 24 outputs the read data stored in the latch circuit XDL for the plane PB0, to the memory controller 3.

Subsequently, the memory controller 3 issues a transfer command "3Fh" with respect to the NAND-type flash memory 2. In response to the transfer command "3Fh," the control circuit 24 transfers the program data stored in the latch circuit XDL for the plane PB1, to the latch circuit XDL for the plane PB0. That is, the control circuit 24 returns the program data temporarily saved in the latch circuit XDL for the plane PB1, to the latch circuit XDL for the plane PB0.

Subsequently, the memory controller 3 executes a program command with respect to the NAND-type flash memory 2. That is, the memory controller 3 issues an input command "80h," an address Add for the plane PB0, and an auto program command "10h" with respect to the NAND-type flash memory 2 (step (3) in FIG. 20). Here, as illustrated in FIG. 20, the program data is already stored in the latch circuit XDL. Accordingly, the program data is not included in the second program command sequence.

Thereafter, the control circuit 24 executes a program operation using the program data stored in the latch circuit XDL. Accordingly, the program data stored in the latch circuit XDL is written on the plane PB0.

[3-3] Effect of Third Embodiment

According to the third embodiment, as in the first embodiment, in a sequence in which the program operation is suspended and the read operation is performed, it becomes possible to store program data in the NAND-type flash memory 2.

In parallel with the read operation, a data transfer processing between the data registers 29-0 and 29-1 may be executed. Accordingly, in the third embodiment, as compared to the first embodiment, an operation time may be shortened by a time corresponding to swap-scan.

[4] Fourth Embodiment

A fourth embodiment corresponds to an example of a memory cell transistor MT capable of storing data of 2 bits or more.

[4-1] Threshold Voltage Distribution of Memory Cell Transistor

Figure 21:
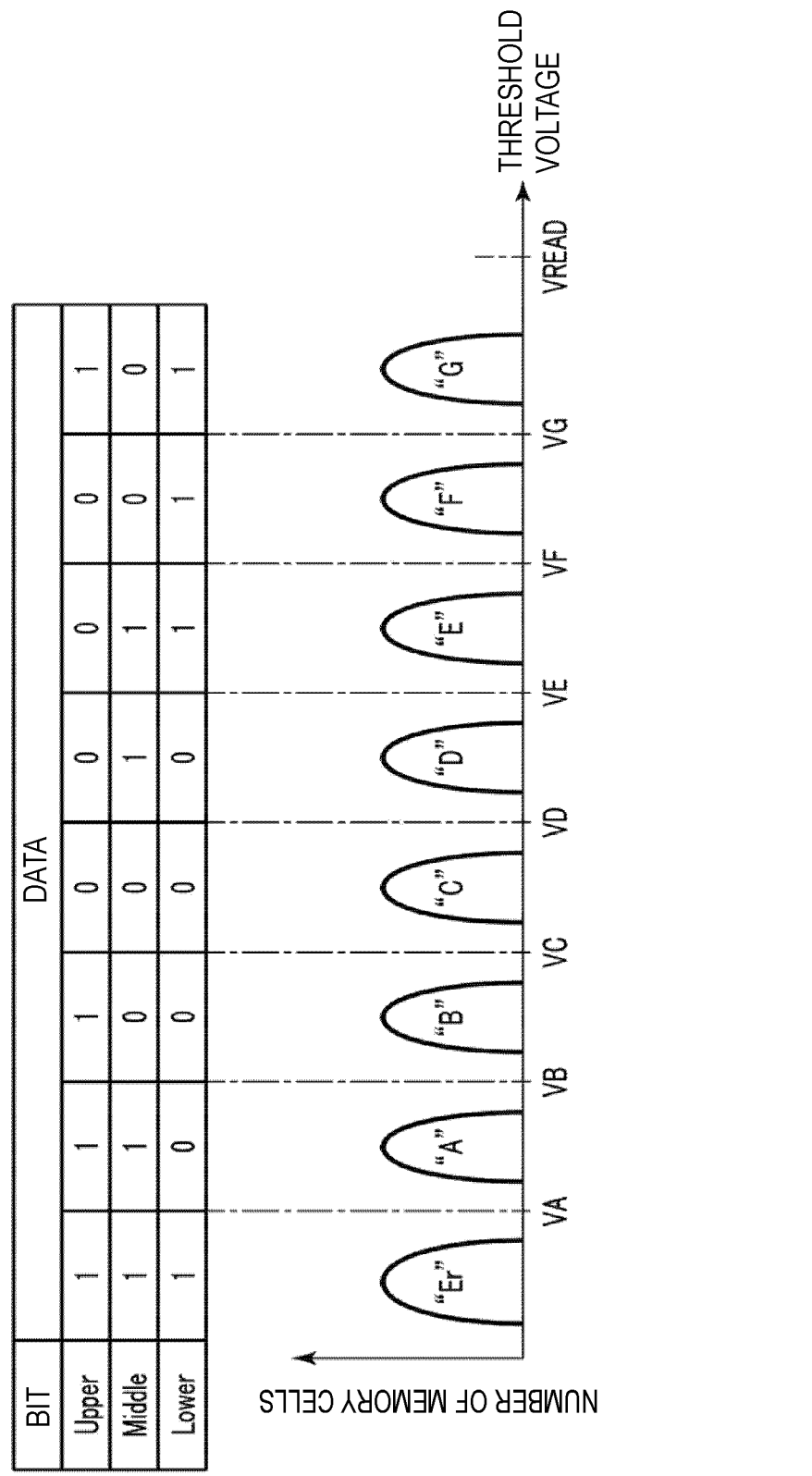
FIG. 21 is a schematic view illustrating an example of a threshold voltage distribution of memory cell transistors according to a fourth embodiment.

Descriptions will be made on a distribution of threshold voltages Vth that memory cell transistors MT may take. FIG. 21 is a schematic view illustrating an example of a threshold voltage distribution of memory cell transistors MT. The memory cell transistor MT is capable of storing data of 2 bits or more. In the present embodiment, descriptions will be made on the case where the memory cell transistor MT stores three-bit data, a so-called triple level cell (TLC) mode, as an example.

The three-bit data is defined by a lower bit, a middle bit, and an upper bit. When the memory cell transistor MT stores 3 bits, the memory cell transistor MT may take any one of eight states corresponding to threshold voltages. The eight states are called states "Er," "A," "B," "C," "D," "E," "F," and "G" in order from the lowest. A plurality of memory cell transistors MT belonging to each of the states "Er," "A," "B," "C," "D," "E," "F," and "G" form a distribution.

For example, data "111", "110", "100", "000", "010", "011", "001", and "101" are assigned to the states "Er," "A," "B," "C," "D," "E," "F," and "G," respectively. Bits are arranged as "X, Y, Z" when an upper bit is "X," a middle bit is "Y," and a lower bit "Z." An assignment of the threshold voltage distribution and data may be freely designed.

In order to read data stored in the memory cell transistor MT as a read target, a state to which the threshold voltage of the corresponding memory cell transistor MT belongs is determined. For determination of the state, read voltages VA, VB, VC, VD, VE, VF, and VG are used.

The state "Er" corresponds to, for example, a state where data is erased (an erase state). The threshold voltage of the memory cell transistor MT belonging to the state "Er" is lower than a voltage VA, and has, for example, a negative value.

The states "A" to "G" correspond to states where charges are injected into a charge storage layer and data is written on the memory cell transistor MT. The threshold voltages of the memory cell transistor MT belonging to the states "A" to "G" have, for example, positive values. The threshold voltage of the memory cell transistor MT belonging to the state "A" is higher than a read voltage VA, and is equal to or lower than a read voltage VB. The threshold voltage of the memory cell transistor MT belonging to the state "B" is higher than the read voltage VB, and is equal to or lower than a read voltage VC. The threshold voltage of the memory cell transistor MT belonging to the state "C" is higher than the read voltage VC, and is equal to or lower than a read voltage VD. The threshold voltage of the memory cell transistor MT belonging to the state "D" is higher than the read voltage VD, and is equal to or lower than a read voltage VE. The threshold voltage of the memory cell transistor MT belonging to the state "E" is higher than the read voltage VE, and is equal to or lower than a read voltage VF. The threshold voltage of the memory cell transistor MT belonging to the state "F" is higher than the read voltage VF, and is equal to or lower than a read voltage VG. The threshold voltage of the memory cell transistor MT belonging to the state "G" is higher than the read voltage VG, and is lower than a voltage VREAD.

The voltage VREAD is a voltage applied to a word line WL connected to memory cell transistors MT of a cell unit CU as a non-read target, and is higher than a threshold voltage of the memory cell transistor MT placed in any state. That is, the memory cell transistor MT whose control gate electrode is applied with the voltage VREAD is placed in an ON state regardless of data to be stored.

As described above, each memory cell transistor MT is set to one of eight states, and is capable of storing three-bit data. Writing and reading are performed in units of pages within one cell unit CU. When the memory cell transistor MT stores three-bit data, a lower bit, a middle bit, and an upper bit are allocated to three pages, respectively, within one cell unit CU. Pages for which writing or reading is collectively performed with respect to the lower bit, the middle bit, and the upper bit are called a lower page, a middle page, and an upper page, respectively.

[4-2] Configuration of Sense Amplifier Unit 28 and Data Register 29

Figure 22:
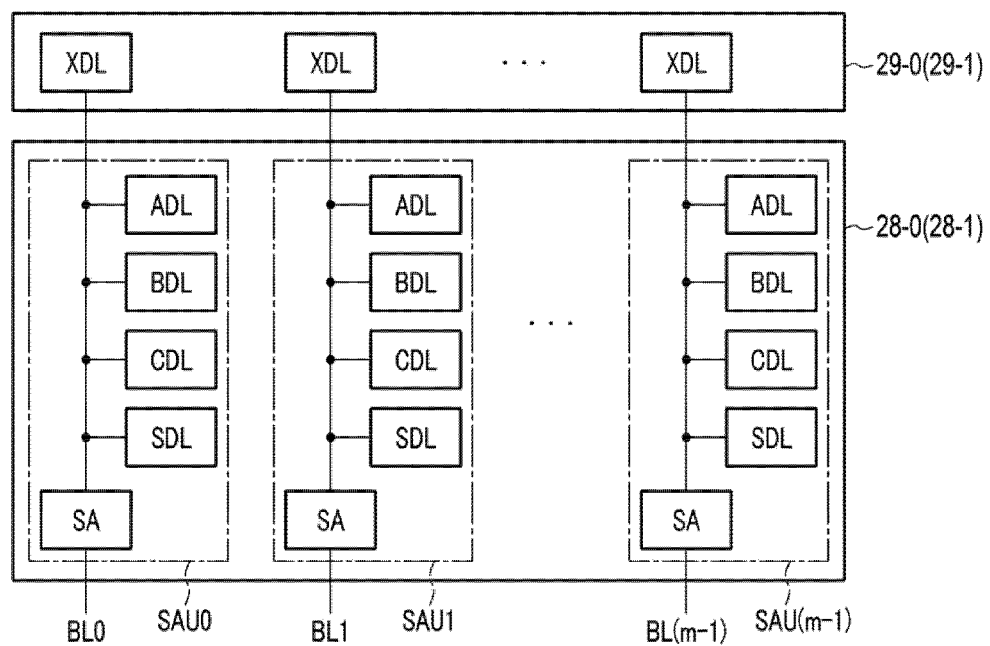
FIG. 22 is a block diagram of a sense amplifier unit and a data register according to the fourth embodiment.

FIG. 22 is a block diagram of the sense amplifier unit 28-0 (28-1) and the data register 29-0 (29-1) according to the fourth embodiment.

Each sense amplifier unit SAU includes a sense amplifier SA, and data latch circuits SDL, ADL, BDL, and CDL. The sense amplifier SA, and the data latch circuits SDL, ADL, BDL, and CDL are connected to each other such that data may be transferable.

The data latch circuits SDL, ADL, BDL, and CDL temporarily store data. At the time of a write operation, the sense amplifier SA controls a voltage of a bit line BL according to data stored by the data latch circuit SDL. The data latch circuits ADL, BDL, and CDL are used for a multi-value operation in which the memory cell transistor MT stores data of 2 bits or more. That is, the data latch circuit ADL is used to store a lower page. The data latch circuit BDL is used to store a middle page. The data latch circuit CDL is used to store an upper page. The number of data latch circuits in the sense amplifier unit SAU may be freely changed according to the number of bits stored by one memory cell transistor MT.

[4-3] Operation

Figure 23A:
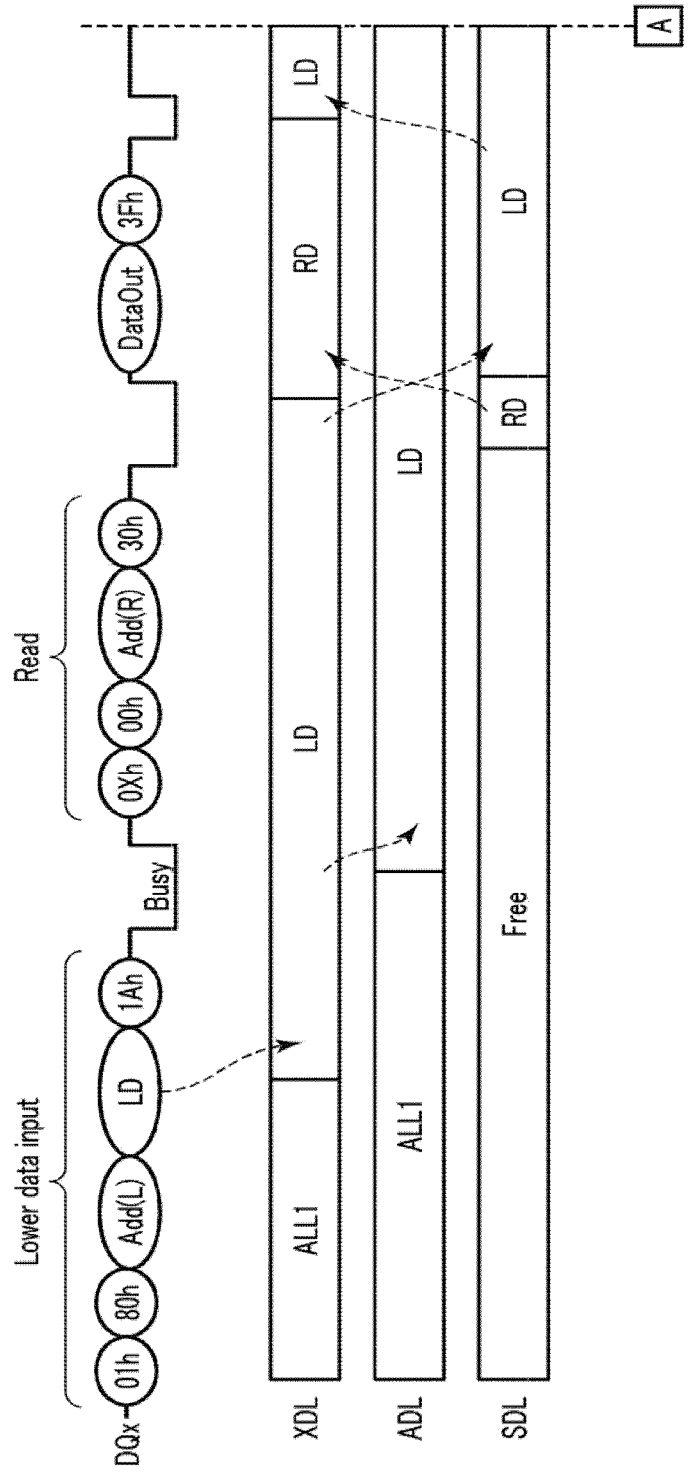
FIG. 23A is a timing chart for explaining a Data In Suspend sequence according to the fourth embodiment.
Figure 23B:
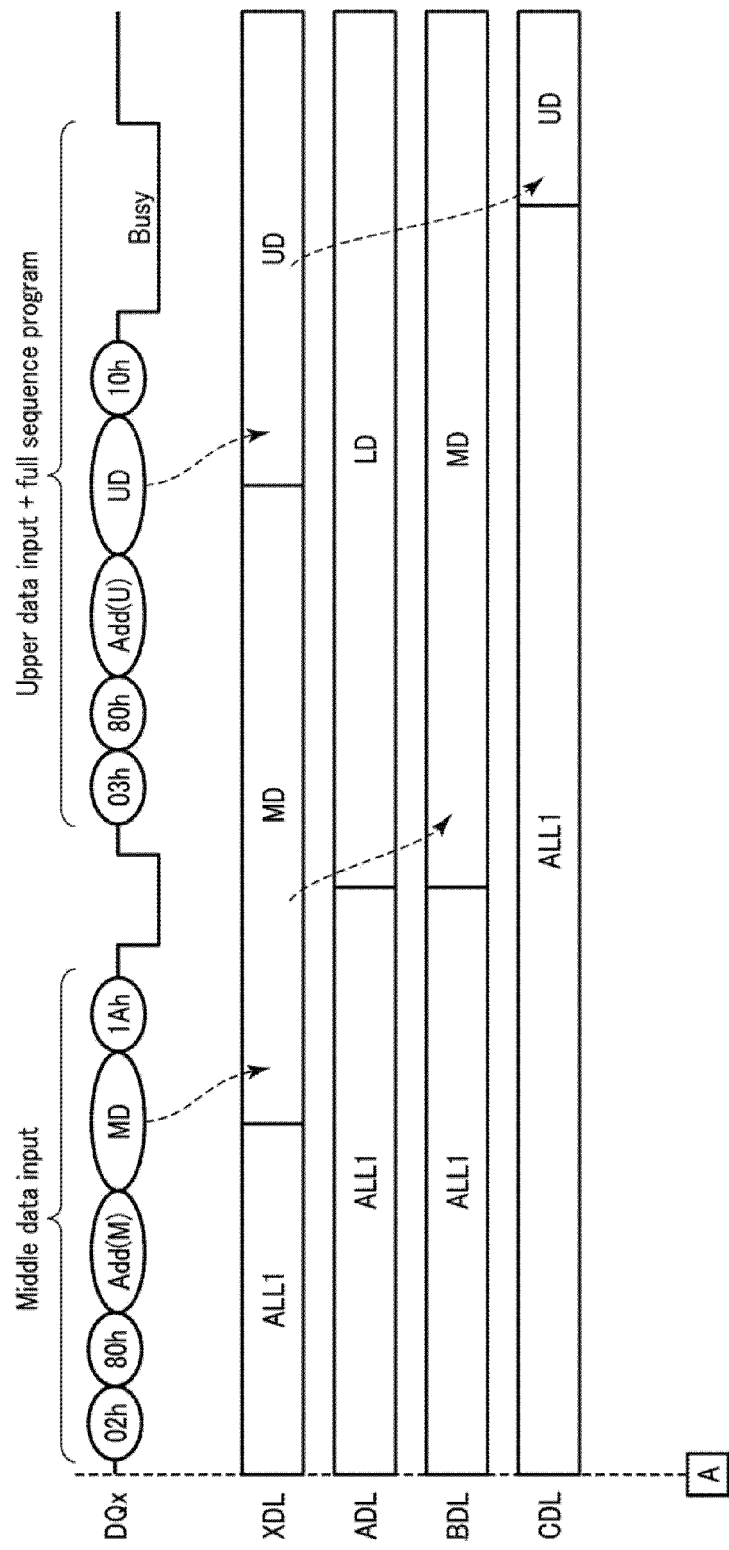
FIG. 23B is a timing chart for explaining the Data In Suspend sequence according to the fourth embodiment.

FIGS. 23A and 23B are timing charts for explaining a Data In Suspend sequence according to the fourth embodiment. For example, it is assumed that program is performed on the plane PB0.

First, the memory controller 3 issues a command "01h," an input command "80h," an address Add (L), data LD, and a multi-program command "1Ah", with respect to the NAND-type flash memory 2. The command "01h" is a command that designates a lower page. The address Add (L) means an address for the lower page. The data LD means lower data (lower page). When receiving the corresponding command sequence, the control circuit 24 temporarily sets the signal RBn to a low level (busy state), and executes a data-in processing. The data LD is transferred sequentially through the latch circuit XDL, and the latch circuit ADL.

Subsequently, the memory controller 3 suspends a program operation. Then, the memory controller 3 executes a read command with respect to the NAND-type flash memory 2. That is, the memory controller 3 issues a command "0Xh," a first read command "00h," an address Add (R) and a second read command "30h" with respect to the NAND-type flash memory 2. The command "0Xh" is a command that designates any page. The address Add (R) is a read address. When receiving the corresponding command sequence, the control circuit 24 temporarily sets the signal RBn to a low level and executes a read operation. Then, as in the first embodiment, a data-output processing, and swap-scan are executed.

Subsequently, the memory controller 3 issues a command "02h," an input command "80h", address Add(M), data MD, and a multi-program command "1Ah" with respect to the NAND-type flash memory 2. The command "02h" is a command that designates a middle page. The address Add (M) means an address for the middle page. The data MD means middle data (middle page). When receiving the corresponding command sequence, the control circuit 24 temporarily sets the signal RBn to a low level (busy state), and executes a data-in processing. The data MD is transferred sequentially through the latch circuit XDL and the latch circuit BDL.

Subsequently, the memory controller 3 issues a command "03h," and input command "80h," an address Add(U), data UD, and an auto program command "10h" with respect to the NAND-type flash memory 2. The command "03h" is a command that designates an upper page. The address Add (U) means an address for the upper page. The data UD means upper data (upper page). When receiving the corresponding command sequence, the control circuit 24 sets the signal RBn to a low level (busy state), and executes a data-in processing. The data UD is transferred sequentially through the latch circuit XDL and the latch circuit CDL.

At this point in time, three-bit data to be written to the memory cell transistor MT is assorted in the latch circuits ADL, BDL, and CDL. Then, the control circuit 24 executes a full sequence program processing of programming the lower page, the middle page, and the upper page at once in the cell unit CU.

[4-4] Effect of Fourth Embodiment

According to the fourth embodiment, it is possible to provide a Data In Suspend sequence, and a full sequence program. As in the first embodiment, it becomes possible to store program data, which was input to the NAND-type flash memory 2 before suspension, within the NAND-type flash memory 2 even after the suspension.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a first memory cell array including first, second, third, and fourth memory cells;
   a first word line connected to a gate of the first memory cell and a gate of the second memory cell;
   a second word line connected to a gate of the third memory cell and a gate of the fourth memory cell;
   a first bit line connected to one end of the first memory cell and one end of the third memory cell;
   a second bit line connected to one end of the second memory cell and one end of the fourth memory cell;
   a first sense amplifier connected to the first bit line;
   a second sense amplifier connected to the second bit line;
   a first internal latch circuit connected to the first sense amplifier;
   a second internal latch circuit connected to the second sense amplifier;
   a first external latch circuit connected to the first internal latch circuit;
   a second external latch circuit connected to the second internal latch circuit; and
   an input/output circuit configured to communicate with an external memory controller, and connected to the first external latch circuit and the second external latch circuit, wherein
   in response to receiving a first write command sequence and a read command sequence subsequent thereto from the external memory controller, the first write command sequence including a write command, a first address corresponding to the first memory cell, and first data, the read command sequence including a read command, a second address corresponding to the third memory cell and the fourth memory cell, the first sense amplifier and the second sense amplifier perform a read operation on the third memory cell and the fourth memory cell to transfer data read therefrom to the first external latch circuit and the second external latch circuit, respectively, and the input/output circuit outputs the data read from the third memory cell and the fourth memory cell to the external memory controller, and in response to receiving a second write command sequence after the read command sequence, the second write command sequence including the write command, a second address corresponding to the second memory cell, and second data, the first sense amplifier and the second sense amplifier perform a write operation on the first memory cell and the second memory cell to write the first data and the second data thereto, respectively.

2. The semiconductor storage device according to claim 1, wherein
the first write command sequence further includes a first command subsequent to the first data, and
the second write command sequence further includes a second command subsequent to the second data, the second command being different from the first command.

3. The semiconductor storage device according to claim 1, wherein
in response to receiving the read command sequence,
the first sense amplifier and the second sense amplifier transfer the data read from the third memory cell and the fourth memory cell into the first external latch circuit and the second external latch circuit, respectively, while the first sense amplifier transfers the first data from the first external latch circuit into the first internal latch circuit, and
in response to receiving a third command from the external memory controller after the input/output circuit outputs the data read from the third memory cell and the fourth memory cell to the external memory controller,
the first external latch circuit and the first internal latch circuit swap data stored therein, and the second external latch circuit and the second internal latch circuit swap data stored therein.

4. The semiconductor storage device according to claim 1, further including:
in response to receiving the write command of the first write command sequence,
the first sense amplifier and the second sense amplifier reset the first external latch circuit and the second external latch circuit, respectively, and
in response to receiving a third command from the external memory controller after the input/output circuit outputs the data read from the third memory cell and the fourth memory cell to the external memory controller,
the first external latch circuit and the first internal latch circuit swap data stored therein, and the second external latch circuit and the second internal latch circuit swap data stored therein.

5. The semiconductor storage device according to claim 1, further including:
a third internal latch circuit connected to the first internal latch circuit, and
a fourth internal latch circuit connected to the second internal latch circuit.

6. The semiconductor storage device according to claim 5, wherein
the control circuit is configured to program the memory cells to one of at least four threshold voltage levels and the first data is lower page data.

7. The semiconductor storage device according to claim 1, wherein
the first memory cell array includes a plurality of memory strings in which a plurality of memory cells are connected in series, the memory strings including
a first memory string including the first memory cell,
a second memory string including the second memory cell,
a third memory string including the third memory cell,
a fourth memory string including the fourth memory cell,
the first bit line is connected to one end of the first memory string and one end of the third memory string, and
the second bit line connected to one end of the second memory string and one end of the fourth memory string.

8. The semiconductor storage device according to claim 7, wherein
the first word line is one of a plurality of a first group of word lines,
the second word line is one of a plurality of a second group of word lines,
word lines of the first group are connected to gates of the memory cells included in the first memory string, respectively, and connected to gates of the memory cells included in the second memory string, respectively, and
word lines of the second group are connected to gates of the memory cells included in the third memory string, respectively, and connected to gates of the memory cells included in the fourth memory string, respectively.

9. The semiconductor storage device according to claim 8, wherein
the word lines of the first group are stacked in a vertical direction, and
the word lines of the second group are stacked in the vertical direction.

10. The semiconductor storage device according to claim 1, wherein
the semiconductor storage device is a NAND-type flash memory.

* * * * *